(12) United States Patent
Yamamoto et al.

(10) Patent No.: US 7,808,242 B2
(45) Date of Patent: Oct. 5, 2010

(54) PROBE FOR NMR MEASUREMENT

(75) Inventors: Hiroyuki Yamamoto, Kokubunji (JP); Kazuo Saitoh, Kodaira (JP); Kenji Kawasaki, Hitachi (JP); Yuzo Fukuda, Hitachi (JP); Michiya Okada, Mito (JP)

(73) Assignee: Hitachi, Ltd., Tokyo (JP)

( * ) Notice: Subject to any disclaimer, the term of this patent is extended or adjusted under 35 U.S.C. 154(b) by 139 days.

(21) Appl. No.: 12/270,996

(22) Filed: Nov. 14, 2008

(65) Prior Publication Data
US 2009/0121718 A1    May 14, 2009

(30) Foreign Application Priority Data
Nov. 14, 2007   (JP) .............................. 2007-295368

(51) Int. Cl.
*G01V 3/00* (2006.01)
(52) U.S. Cl. ...................................... 324/318; 324/322
(58) Field of Classification Search ................. 324/318, 324/322
See application file for complete search history.

(56) References Cited
U.S. PATENT DOCUMENTS
6,958,608 B2 * 10/2005 Takagi et al. ................. 324/318
6,980,000 B2 * 12/2005 Wong et al. .................. 324/318
7,138,801 B2 * 11/2006 Yamamoto et al. ........... 324/318
7,164,269 B2 *  1/2007 Hasegawa et al. ............ 324/318
7,173,424 B2 *  2/2007 Saitoh et al. ................. 324/318
7,619,414 B2 * 11/2009 Yamamoto et al. ........... 324/318
2008/0111548 A1  5/2008 Yamamoto et al.

FOREIGN PATENT DOCUMENTS
JP   2003-302452   10/2003
JP   2005-140651    6/2005
JP   2008-122141    5/2008

* cited by examiner

*Primary Examiner*—Louis M Arana
(74) *Attorney, Agent, or Firm*—Antonelli, Terry, Stout & Kraus, LLP.

(57) ABSTRACT

A probe for nuclear magnetic resonance (NMR) measurement provided with a multiple resonant circuit for detecting signals of two or more nuclides with high detection efficiency for nuclide at low resonant frequency comprises a multiple resonance radio frequency (RF) coil circuit that, with multiple lead lines connected to the RF coil, causes a part of the RF coil, separated by the connection points of the lead lines, to function as the inductor of a trap circuit that cuts off a signal at the frequency $F_1$ for a signal at the resonant frequency $F_1$ of a first nuclide and, at the same time, to function as an RF coil that detects a signal at the frequency $F_2$ for a signal at the resonant frequency $F_2$ of a second nuclide, thus increasing the signal detection efficiency for the nuclide at the frequency $F_2$.

7 Claims, 14 Drawing Sheets

PROBE FOR NMR MEASUREMENT

BACKGROUND OF THE INVENTION

The present invention relates to a probe for a nuclear magnetic resonance apparatus (hereinafter called an NMR apparatus), and more particularly to a probe for NMR measurement that has the circuit configuration and the installation structure of a radio frequency (RF) coil used for transmitting a high-frequency signal at a predetermined resonant frequency to a sample placed in an evenly distributed magnetic field and/or receiving a free induction decay signal (FID signal).

Nuclear magnetic resonance (NMR) spectral measurement, which gives information on a substance at an atomic level, is an excellent measurement method for investigating the structure of a compound. The basic principle of the measurement operation is that a high-frequency magnetic field is applied to a sample placed in an evenly distributed static magnetic field and the response signal from the excited nuclear spin is received and analyzed. The NMR apparatus, capable of analyzing the structure of a compound at an atomic level and measuring from a solid sample to a liquid solution, is used also for analyzing the structure and the function of proteins, structural analysis of a low-molecular compound, etc.

An analysis by means of an NMR apparatus sometimes requires that signals from multiple nuclides be measured at the same time. A probe used for such measurement must have the function to send and receive signals at the frequencies corresponding to multiple nuclides at the same time. For example, an NMR probe for measuring protein substances generally has a radio frequency (RF) coil or a radio frequency (RF) coil circuit installed for simultaneously measuring the four types of nuclides, H, D, C, and N. In such a multiple nuclei measuring probe, one radio frequency (RF) coil is generally resonated by multiple frequencies (multiple resonance). That is, the resonance characteristics of the radio frequency (RF) coil are tuned with the resonant frequency of the nuclides and, at the same time, the impedance at each resonant frequency is matched to a particular value (generally, 50Ω). An example of the configuration of a double resonant circuit that makes possible a multiple nuclei measurement is disclosed in Patent Document 1 (JP-A-2003-302452) and Patent Document 2 (JP-A-2005-140651).

The sensitivity of NMR measurement depends on the Q value of the radio frequency (RF) coil circuit. The Q value is a factor that depends on the resistive loss in the radio frequency (RF) coil circuit; the lower the resistive loss is, the higher the Q value is and the higher the detection sensitivity is. The conventional radio frequency (RF) coil circuit disclosed in the Patent Document 1 and Patent Document 2 is constructed based on the circuit shown in FIG. 1. In this circuit configuration, the capacitance of matching capacitors 44 and 46 is high with the problem that the resistive loss in the circuit is increased. In the case of the material and the shape of a general radio frequency (RF) coil, the capacitance value is in the range from several tens of pF to 100 pF. The problem with a chip capacitor normally used in a radio frequency (RF) coil circuit is that, when the capacitance is increased, the resistances 43 and 47 due to an inductive loss are increased because of the characteristics of the parts. So, when such a high-capacitance part is used, the Q value is decreased because of an increase in the resistive loss in the whole radio frequency (RF) coil circuit and therefore the detection efficiency is decreased.

This problem becomes obvious when the resistance of the RF coil is decreased. To increase the Q value of a radio frequency (RF) coil, it is effective to cool the RF coil for decreasing the resistance or to use a low-resistance material such as a superconducting material. However, when the resistance of the RF coil is decreased, it is necessary to further increase the value of the matching capacitor 44 for impedance matching. So, even if the RF coil has a high Q value (low resistive loss), the problem is that the Q value of the whole circuit cannot be sufficiently increased because the loss of the capacitor cannot be decreased.

[Patent Document 1] JP-A-2003-302452
[Patent Document 2] JP-A-2005-140651

SUMMARY OF THE INVENTION

It is an object of the present invention to provide an NMR probe that achieves high detection efficiency without decreasing the Q value. In particular, it is an object of the present invention to provide a probe for nuclear magnetic resonance (NMR) measurement that is an NMR probe comprising a multiple resonant circuit for detecting signals of two or more nuclides and that has high detection efficiency for a nuclide at a low resonant frequency.

With multiple lead lines connected to the RF coil, a multiple radio frequency (RF) coil circuit is configured by causing a part of the RF coil, separated by the connection points of lead lines, to function as the inductor of a trap circuit that cuts off a signal at the frequency $F_1$ for a signal at the resonant frequency $F_1$ of a first nuclide and, at the same time, to function as an RF coil that detects a signal at the frequency $F_2$ for a signal at the resonant frequency $F_2$ of a second nuclide, thus increasing the signal detection efficiency for the nuclide at the frequency $F_2$.

FIG. 2A is a diagram showing the configuration of a radio frequency (RF) coil circuit invented for decreasing a capacitor loss.

In this circuit, a signal line is connected from approximately the midpoint of an RF coil 50, and variable-capacitance trimmer capacitors 40 and 41 are connected to both ends of the RF coil 50. A resistance 52 represents the parasitic resistance of the RF coil, and resistances 42 and 43 represent the resistive loss caused by the inductive loss of the trimmer capacitors. FIG. 2B is a diagram created by rewriting the equivalent circuit diagram in FIG. 2A for easy understanding. Because the signal line is connected from the midpoint of the RF coil 50, the circuit configuration is viewed from the connection point of the signal line in such a way that the inductance of the RF coil 50 is divided into two inductors 50-1 and 50-2. For convenience, the mutual inductance between the inductances 50-1 and 50-2 is ignored in the description below. Resistances 52-1 and 52-2 are the parasitic resistances of the inductors 50-1 and 50-2, respectively. So, when viewed from the connection point of the signal line, this radio frequency (RF) coil circuit is a resonant circuit in which a series resonant circuit 90, which is composed of the inductor 50-1, trimmer capacitor 40, and resistances 52-1 and 42, and a series resonant circuit 91, which is composed of the inductor 50-2, trimmer capacitor 41, and resistances 52-2 and 43, are connected in parallel.

FIG. 2C is a diagram showing the resonance characteristics of this radio frequency (RF) coil circuit. FIG. 2C indicates that this circuit has the resonant frequency $F_A$ of the series resonant circuit 90 and the resonant frequency $F_B$ of the series resonant circuit 91 and that the resonance characteristics of the circuit are that the resonant frequency $F_0$ of the parallel resonant circuit, which is composed of the series resonant circuit 90 and the series resonant circuit 91, occurs between $F_A$ and $F_B$. In addition, the parallel resonance peak of the resonant frequency $F_0$ can has its impedance varied by the values of $F_A$ and $F_B$. The larger the frequency interval between $F_A$ and $F_B$ is, the higher the impedance of the parallel resonance peak is. Conversely, the smaller the frequency interval between $F_A$ and $F_B$ is, the lower the impedance of the parallel resonance peak is. Therefore, by simply adjusting the capacitance values of the trimmer capacitors 40 and 41 to control the series resonant frequencies $F_A$ and $F_B$, the resonance characteristics can be obtained in which the parallel resonant frequency $F_0$ is tuned to a desired frequency and, at the same time, the impedance is matched to a specific value, for example, 50Ω. So, even if the resistance of the RF coil is extremely low, the resonance characteristics can be tuned and matched without greatly increasing the values of the trimmer capacitors 40 and 41 provided for tuning and matching. That is, because capacitor losses 42 and 43 can be suppressed, a radio frequency (RF) coil that does not decrease the Q value of the RF coil, which is normally high, can be implemented.

FIG. 3 is a diagram showing a double resonant circuit whose configuration is based on the radio frequency (RF) coil circuit shown in FIG. 2A. A signal line 60 is connected from approximately the midpoint of the RF coil 50, and the trimmer capacitors 40 and 41 are connected to the ends of the RF coil 50. In addition, a trap circuit 56-1, composed of an inductor 92-1 and a capacitor 93-1, and a trimmer capacitor 94 are connected in series to one end of the RF coil 50. The same configuration of the trap circuit 56-1 and the trimmer capacitor 94 is formed at the other end of the RF coil.

Let $F_1$ and $F_2$ ($F_1 > F_2$) be the two resonant frequencies of this double resonant circuit. The trimmer capacitors 40 and 41 are used to tune and match the resonance peak of the resonant frequency $F_1$. On the other hand, trimmer capacitors 94 and 95 are used to tune and match the resonance peak of the resonant frequency $F_2$. The trap circuit 56-1 is an element circuit used to cut off the high-frequency signal of the resonant frequency $F_1$ and, at the frequency $F_1$, the inductor 92-1 and the capacitor 93-1 resonate in parallel to cause extremely high impedance. A trap circuit 56-2 operates in the same manner.

At the frequency $F_1$, the element circuits 97-1 and 97-2 enclosed by the broken lines may be ignored because there are trap circuits 56-1 and 56-2, and the circuit virtually comprises only the RF coil 50 and trimmer capacitors 40 and 41. This means that, even if the capacitance values of the trimmer capacitors 94 and 95 are changed, the resonance characteristics at the resonant frequency $F_1$ are not affected.

On the other hand, at the frequency $F_2$, the traps 56-1 and 56-2 behave as inductors. The inductance components, the RF coil 50, and trimmer capacitors 40, 41, 94, and 95 constitute the circuit. Therefore, this radio frequency (RF) coil circuit first adjusts the capacitance values of the trimmer capacitors 40 and 41 to match the resonance characteristics at the frequency $F_1$ to 50Ω and, after that, adjusts the capacitance values of the trimmer capacitors 94 and 95 to match the resonance characteristics at the frequency $F_2$ to 50Ω. The procedure described above is used to tune and match the resonance characteristics of the two resonant frequencies $F_1$ and $F_2$.

According to the principle of measurement, the signal detection sensitivity of NMR measurement depends on the resonant frequency of a nuclide. The measurement sensitivity of a nuclide having a low resonant frequency is potentially lower than that of a nuclide having a higher resonant frequency. When a double resonant circuit is built, circuit elements are further added to a single resonant circuit. Because the resistive loss of the added elements increases the loss of the entire radio frequency (RF) coil circuit (decreases the Q value), the measurement sensitivity of a nuclide having a low resonant frequency is further decreased.

In the case of the circuit configuration shown in FIG. 3, the inductor elements 92-1 and 92-2 required for the configuration of the double resonant circuit are added to the basic circuit shown in FIG. 2A and, therefore, the detection efficiency is decreased for the reason described above.

To solve this problem, the present invention uses the following configuration to implement a radio frequency (RF) coil circuit that satisfies the object.

In a double resonance radio frequency (RF) coil circuit that detects signals from two nuclides, a first capacitor (C1) and a fourth capacitor (C4) are connected to the ends of a first lead line and a fourth lead line that are extended from both ends of the turns of the RF coil, a second lead line and a third lead lint are extended from predetermined inner positions of the both ends of the RF coil, and a second capacitor (C2) and a third capacitor (C3) are connected to the ends of the second lead line and the third lead line. The other electrodes of C1, C2, C3, and C4 are grounded. In addition, the first lead line and the second lead line are connected via a fifth capacitor (C5) and, similarly, the third lead line and the fourth lead line are connected via a sixth capacitor (C6). In addition, in the RF coil, a fifth lead line is connected between the connection point of the second lead line and the connection point of the third lead line, and the end of the fifth lead line is connected to the core line of the signal line for transmitting and receiving a high frequency signal. The signal line is branched into two after the probe, and one of them is connected to the frequency $F_1$ transmitter/receiver via the filter through which the band of the frequency $F_1$ passes and the other is connected to the frequency $F_2$ transmitter/receiver via the filter through which the band of the frequency $F_2$ passes. Variable-capacitance trimmer capacitors are used for C1, C2, C3, and C4. If there is no need to adjust the capacitance values, a fixed-capacitance capacitor may be used for one of C1 and C4 and for one of C2 and C3. Variable-capacitance trimmer capacitors are used also for C5 and C6 but, if there is no need to adjust the capacitance values, fixed-capacitance capacitors may of course be used.

In the description below, an area between the first lead line and the second lead line in the RF coil is called an RF coil element 1 (L1). An area between the second lead line and the third lead line is called an RF coil element 2 (L2). An area between the third lead line and the fourth lead line is called an RF coil element 3 (L3).

Let $F_1$ be the higher resonant frequency of the two resonant frequencies $F_1$ and $F_2$, and let $F_2$ be the lower frequency. At the frequency $F_1$, the element circuit composed of L1 and C5 and the element circuit composed of L3 and C6 are virtually invisible because the impedance becomes high. As a result, the signal of a nuclide having the resonant frequency $F_1$ is detected by the radio frequency (RF) coil circuit comprising the RF coil element 2 (L2) between L1 and L3, the second and third lead lines, and C2 and C3.

At the frequency $F_2$, because L1 and L3 function as inductors, the signal of a nuclide having the resonant frequency $F_2$ is detected by the radio frequency (RF) coil circuit comprising the whole RF coil and all associated lead lines and capacitors.

In the radio frequency (RF) coil circuit of the present invention, the inductance elements required to implement double resonance are used as the RF coil element 1 (L1) and the RF coil element 3 (L3). That is, the present invention is characterized in that the inductor of the trap circuit, which is used only as a component element of an electric circuit in the circuit shown in FIG. 3, is used to detect the signal at the frequency $F_2$ for increasing the signal detection efficiency at the frequency $F_2$. Although the configuration for increasing the signal detection efficiency of a nuclide at a low frequency is disclosed in Patent Document 2 from the same view point, the disclosed configuration is significantly different from the present invention in the circuit configuration.

With the configuration of this radio frequency (RF) coil as the base, it is also possible to implement a circuit that resonates at more frequencies (triple resonant circuit, quadruple resonant circuit). In that case, it is required to add an element circuit with the same configuration as that of an element circuit, which comprises the RF coil element 1 (L1), first lead line, first capacitor (C1), and fifth capacitor (C5), to both sides of the RF coil.

As a result, for use in a multiple resonant radio frequency (RF) coil circuit used for a multiple nuclei measuring NMR probe, it is possible to provide the circuit configuration and the implementation method that implement the tuning/matching of resonance characteristics at multiple frequencies without decreasing the Q value of the RF coil, which is normally high, and that ensure high for transmitting/receiving efficiency for a nuclide having a low resonant frequency.

In particular, because an inductor element used in the multiple resonant circuit configuration may also be used as an RF coil, the efficiency of for transmitting/receiving a high-frequency signal can be increased for a nuclide having a low resonant frequency. In addition, even for a probe using an RF coil that has an extremely low resistive loss such as an RF coil made of normal conduction metal or superconductor cooled down to an extremely low temperature, it is possible to implement a multiple resonance radio frequency (RF) coil circuit that does not decrease the Q value of the RF coil that is normally high.

Other objects, features and advantages of the invention will become apparent from the following description of the embodiments of the invention taken in conjunction with the accompanying drawings.

DESCRIPTION OF THE EMBODIMENTS

Embodiments of the present invention will be described in detail with reference to the drawings.

Figure 1:
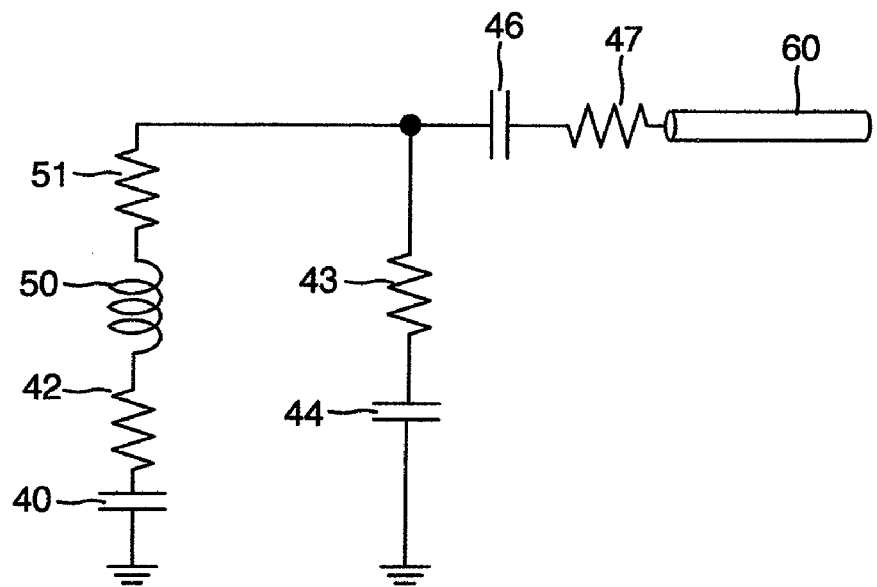
FIG. 1 is a diagram showing an example of the equivalent circuit of a conventional radio frequency (RF) coil.
Figure 2A:
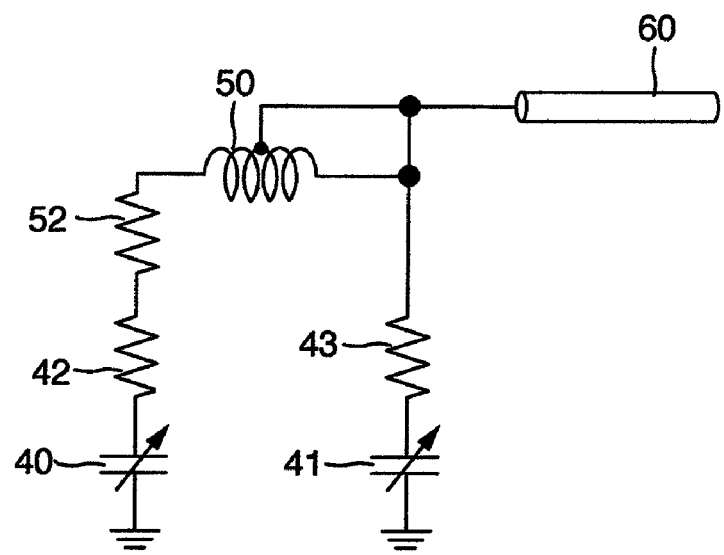
FIG. 2A is a diagram showing an example of the equivalent circuit of a radio frequency (RF) coil.
Figure 2B:
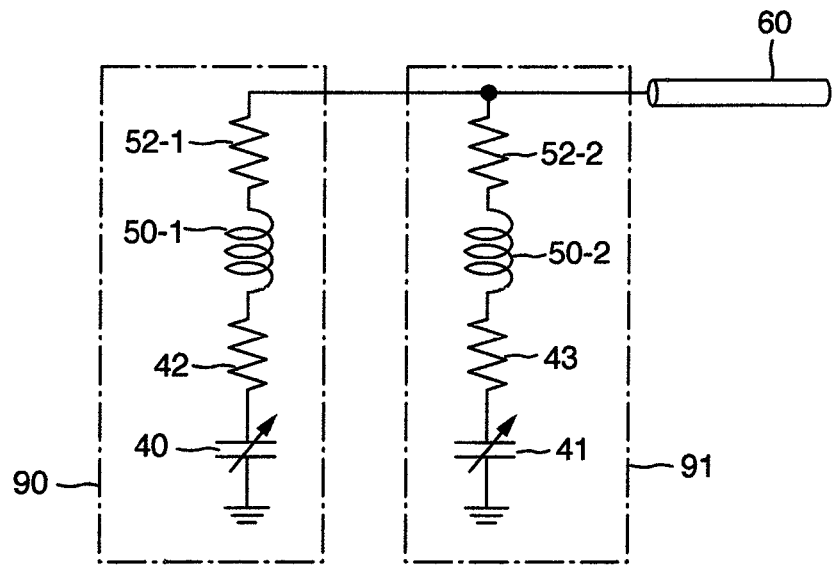
FIG. 2B is an equivalent circuit diagram created by rewriting FIG. 2A for easy understanding.
Figure 2C:
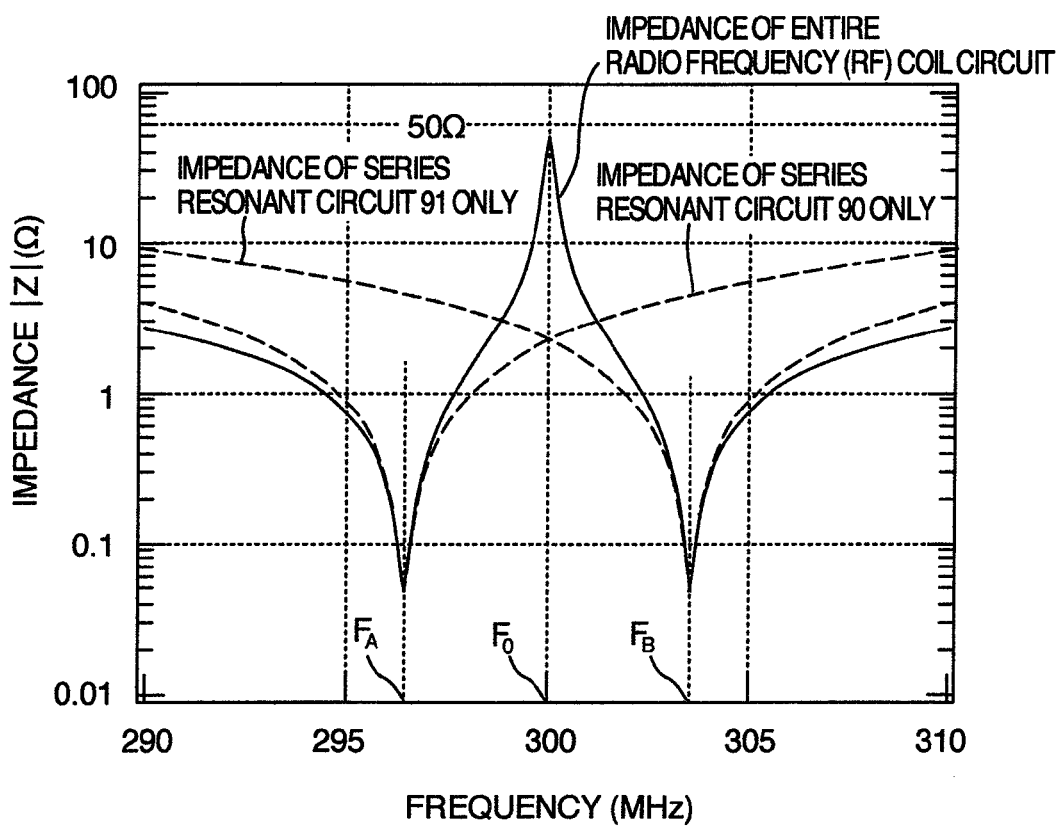
FIG. 2C is a diagram showing the frequency dependency of the impedances of the circuits in FIG. 2A.
Figure 3:
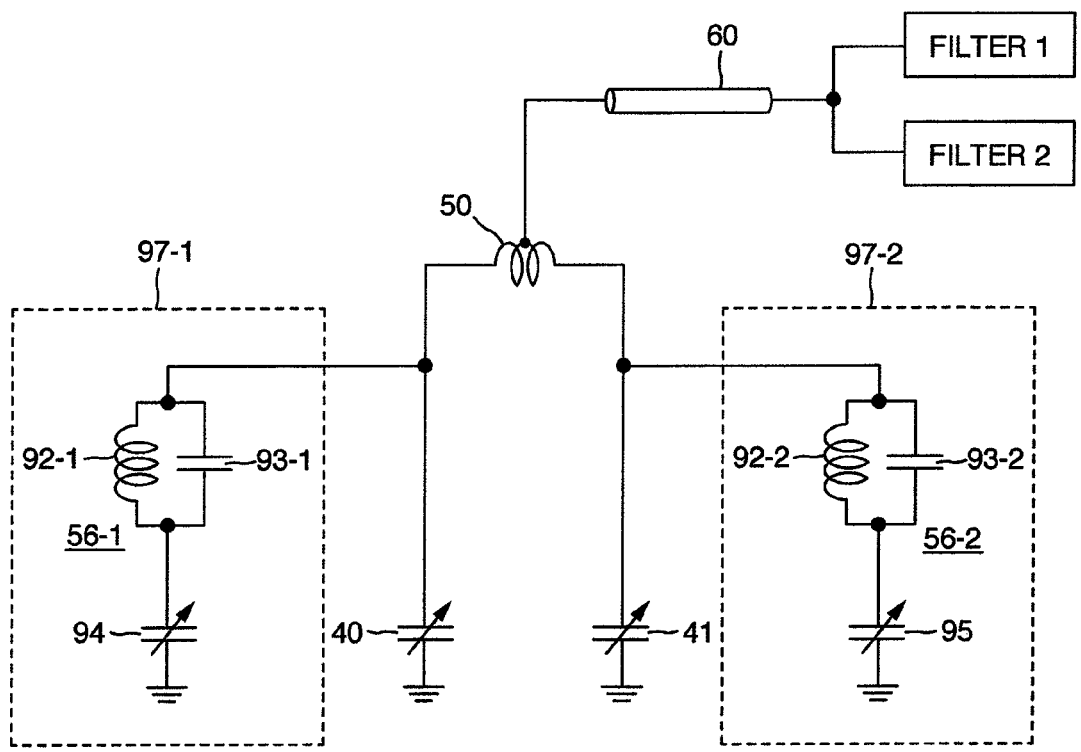
FIG. 3 is a diagram showing an example of the equivalent circuit of a double resonant circuit in the radio frequency (RF) coil.
Figure 4A:
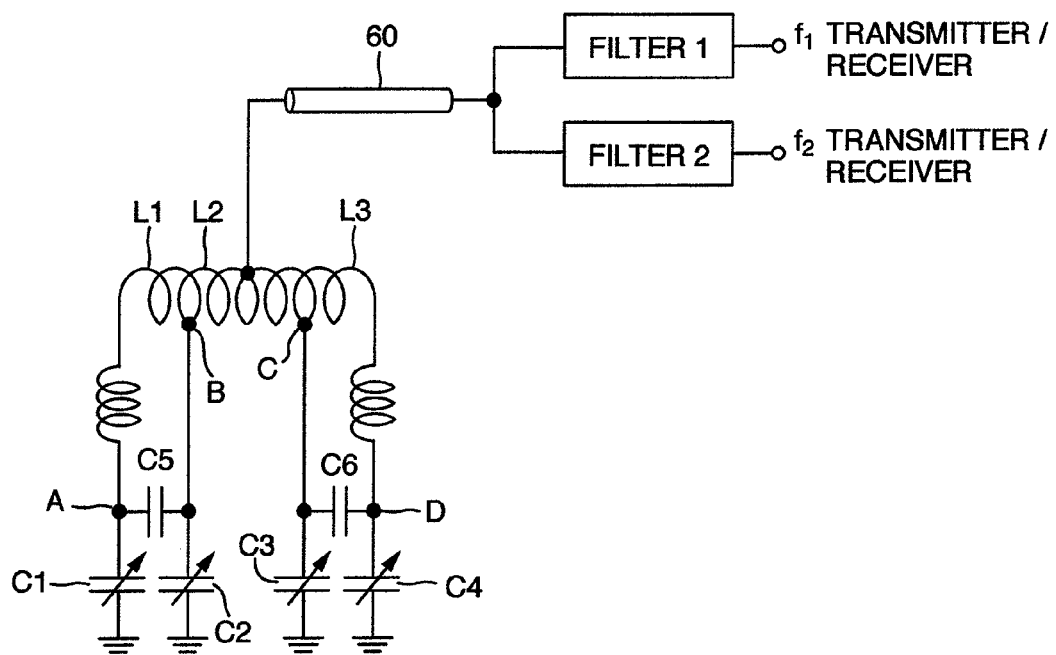
FIG. 4A is a diagram showing the equivalent circuit of a double resonant RF coil circuit of the present invention.
Figure 4B:
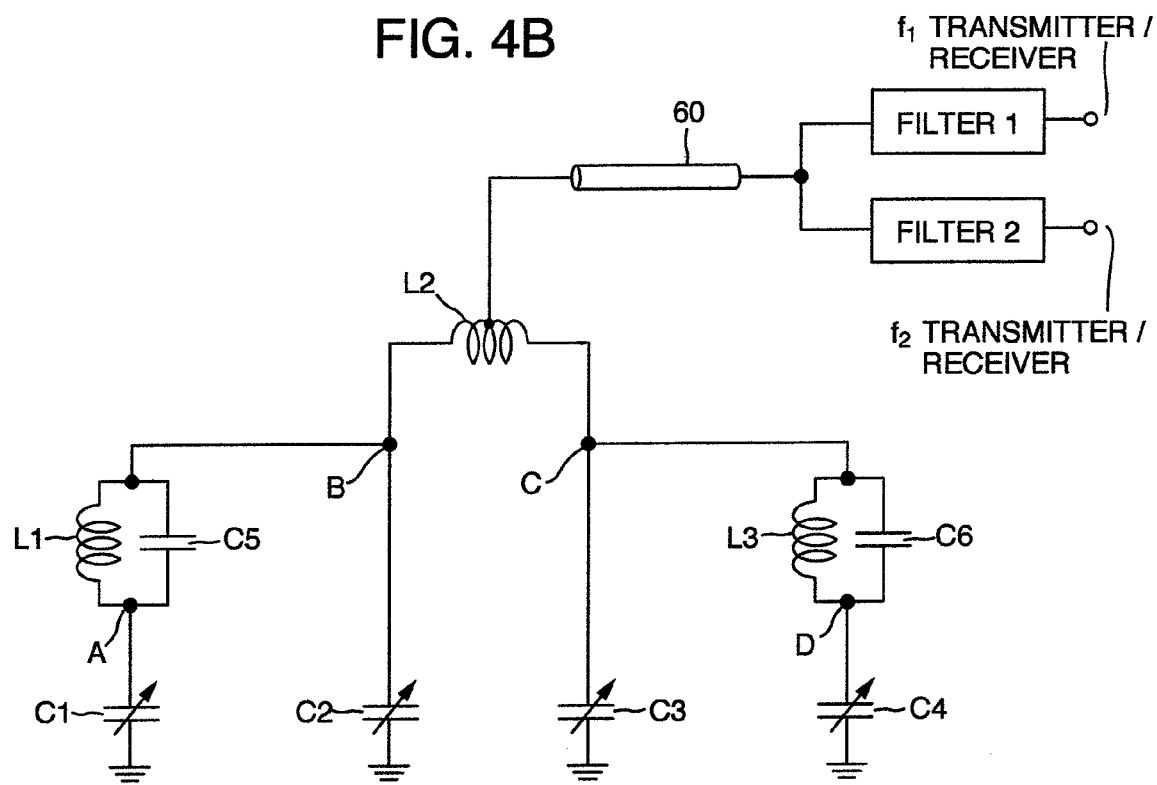
FIG. 4B is an equivalent circuit diagram created by rewriting FIG. 4A for easy understanding.

FIG. 4A is a diagram showing the equivalent circuit of a double resonant radio frequency (RF) coil circuit of the present invention. A signal line is connected from approximately the midpoint of a RF coil 50, and four lead lines are extended from both ends, and from inner positions, of the RF coil. The following describes the RF coil 50 by dividing its area into three. An area from point A to point B is RF coil element 1 (L1). An area from point B to point C is RF coil element 2 (L2). An area from point C to point D is RF coil element 3 (L3). FIG. 4B is a diagram showing an equivalent circuit created by rewriting the equivalent circuit in FIG. 4A for easy understanding. This figure indicates that, as an electric circuit, the circuit is equivalent to the double resonance radio frequency (RF) coil shown in FIG. 3. The following describes the operation of this circuit in detail with reference to FIG. 4B.

Figure 5A:
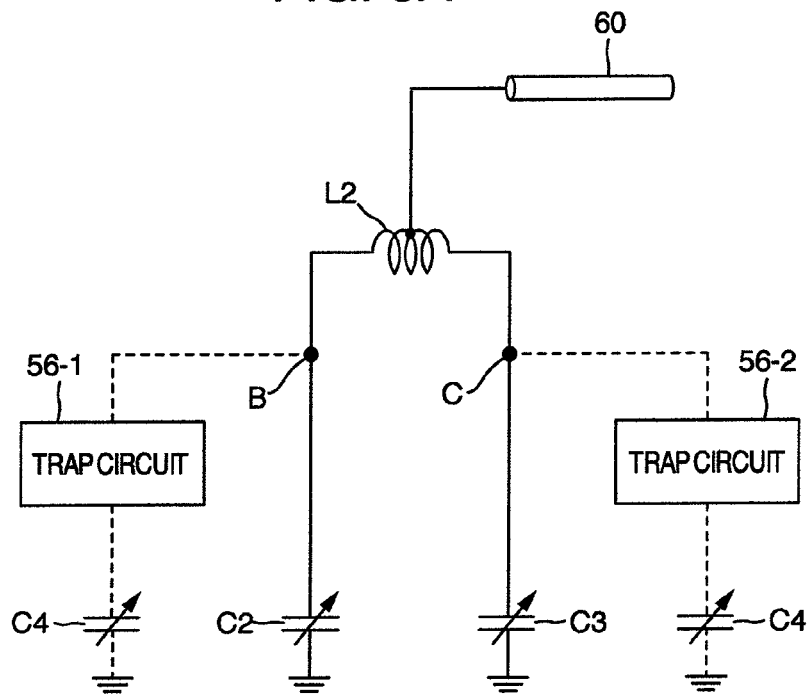
FIG. 5A is a diagram schematically showing the state of the circuit at the resonant frequency $F_1$ for the double resonant radio frequency (RF) coil circuit of the present invention.

This radio frequency (RF) coil circuit resonates at two frequencies, $F_1$ and $F_2$. Let $F_1$ be the higher resonant frequency, and let $F_2$ be the lower resonant frequency. First, the following describes the operation at the frequency $F_1$. FIG. 5A is a diagram schematically showing the state of the circuit at the frequency $F_1$. An element circuit 56-1 is a circuit shown in FIG. 4B composed of L1 and C5, and an element circuit 56-2 is a circuit composed of L3 and C6. At the frequency $F_1$, the capacitance value of C5 is set so that it resonates in parallel with L1. Similarly, the capacitance value of C6 is set so that it resonates in parallel with L3 at the frequency $F_1$. Therefore, the impedance of element circuits 51-1 and 51-2 becomes extremely high at the frequency $F_1$. As a result, when viewed from L2, the circuits beyond point B and point C become invisible because of the high impedance and so this circuit becomes equivalent to a circuit composed only of L2, C2, and C3. That is, because the resonance characteristics near the frequency $F_1$ are not interfered by the values of C1 and C4, the resonance characteristics can be tuned and matched by adjusting only two trimmer capacitors C2 and C3.

Figure 5B:
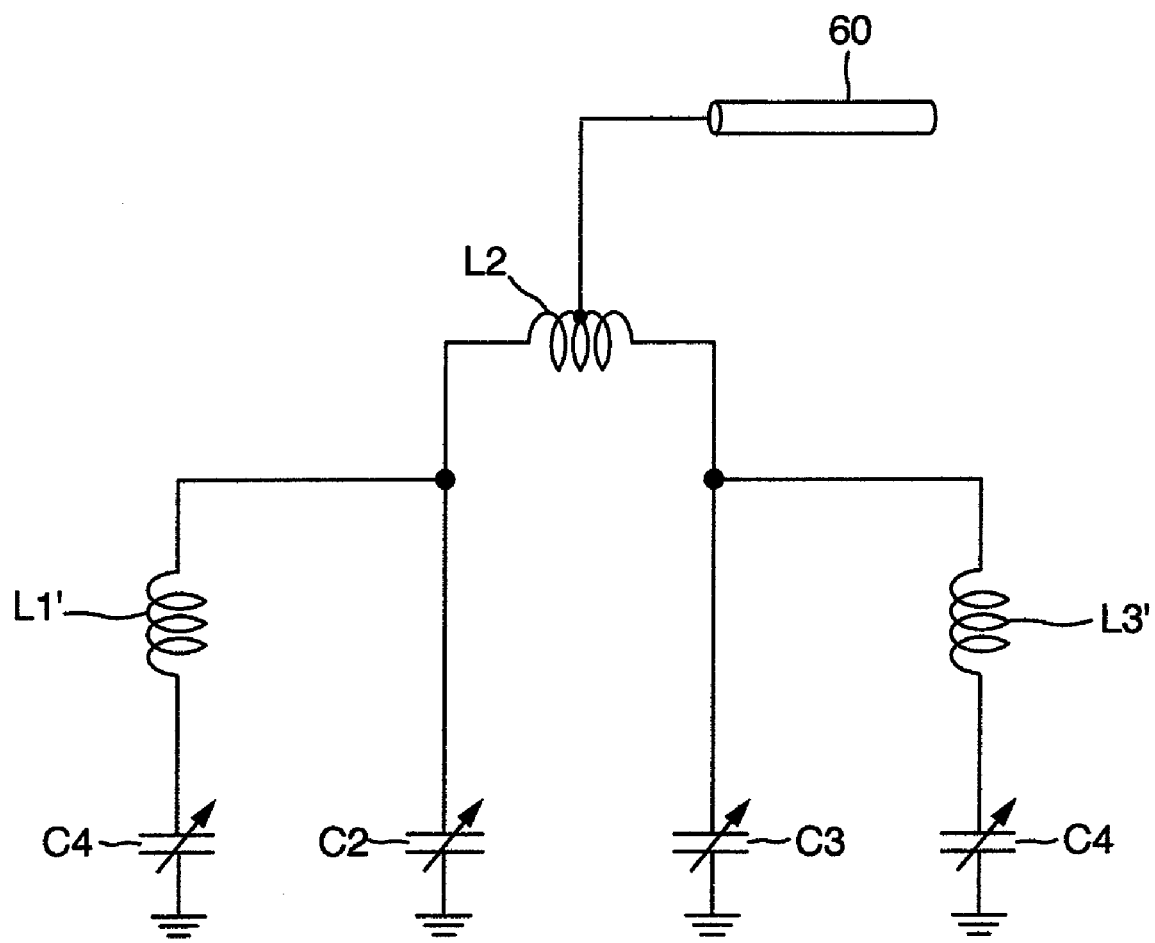
FIG. 5B is a diagram schematically showing the state of the circuit at the resonant frequency $F_2$ for the double resonant radio frequency (RF) coil circuit of the present invention.

Next, the following describes the operation at the frequency $F_2$ that is the lower frequency. FIG. 5B is a diagram showing the state of the circuit at the frequency $F_2$. At the frequency $F_2$, the trap circuit 56-1 shown in FIG. 5A, which is composed of L1 and C5, functions as the inductor L1' as shown in FIG. 5B. Similarly, the trap circuit 56-2 composed of L3 and C6 functions as the inductor L3'. The series circuit of L1' and C1 and the series circuit of L3' and C4 are combined, and the combined whole circuit functions as a capacitor. That is, in this configuration, the four capacitors are connected to the ends of the RF coil element 2 (L2). Because the capacitors are connected in parallel to C2 and C3, the circuit resonates, not at the resonant frequency $F_1$ of the circuit composed of L2, C2, and C3, but at the frequency $F_2$ that is lower. The resonance characteristics near the frequency $F_2$ are affected not only by the capacitance values of C1 and C4 but also by the capacitance values of C2 and C3. On the other hand, the resonance characteristics near the frequency $F_1$ are not affected by C1 and C4. Therefore, in the procedure for tuning and matching the resonance characteristics at $F_1$ and $F_2$ in this double resonant circuit, the resonance characteristics at the frequency $F_1$ are tuned and matched by adjusting C2 and C3. After that, with the values of C2 and C3 fixed, the resonance characteristics at the frequency $F_2$ are tuned and matched by adjusting the values of C1 and C4. The method described above allows the impedance of the radio frequency (RF) coil circuit to be matched to a predetermined value (generally, 50Ω) at the resonant frequencies $F_1$ and $F_2$ of the two nuclides.

As shown in FIG. 4A and FIG. 4B, a filter 1 and a filter 2 are provided beyond the branch point after the signal line 60. The filter 1 is the band pass filter of the frequency $F_1$, and the filter 2 is the band pass filter of the frequency $F_2$. The high frequency signals at the frequencies $F_1$ and $F_2$, which are received by the radio frequency (RF) coil, are transmitted through the signal line 60 and are distributed at the branch point after the signal line 60, and those filters cause only the signals at the frequency $F_1$ to be transmitted to one of the branches and the signals at the frequency $F_2$ to be transmitted to the other of the branches. This configuration prevents leakage signals at different frequencies from entering the signal detector in a subsequent stage of the filters.

As shown in FIG. 5B, the element circuits 51-1 and 51-2 function as inductors at the frequency $F_2$. As shown in FIG. 4A, because a part of L1 and L3 of the element circuits is arranged around a sample as the RF coil in the present invention, they can contribute to the transmission/reception of high frequency signals for a nuclide at the resonant frequency $F_2$. As a result, the inductors L1 and L3, which have been used simply as element devices for constituting a double resonant circuit, can also detect signals, thus increasing the signal detection sensitivity for a nuclide at the resonant frequency $F_2$.

The following describes embodiments of the present invention.

First Embodiment

Figure 6A:
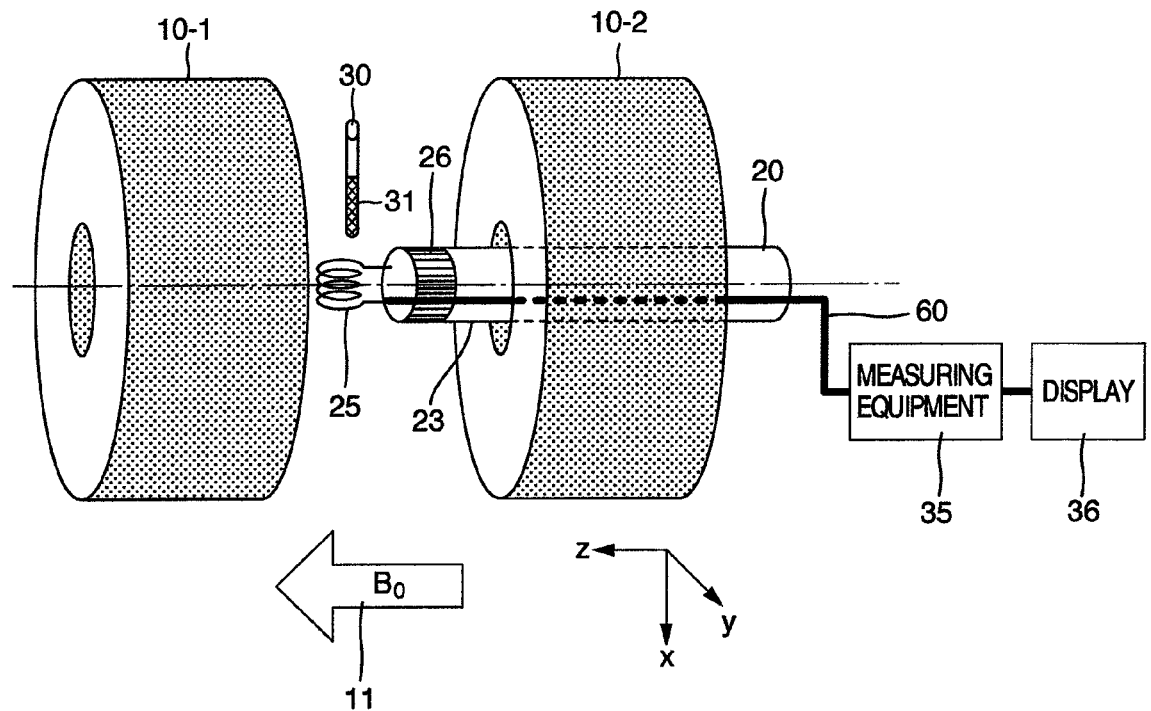
FIG. 6A is a perspective view showing the overview and the arrangement of the main components of an NMR apparatus that generates an evenly distributed magnetic field in the horizontal direction.

FIG. 6A is a perspective view showing the overview and the arrangement of the main components of an NMR apparatus of the present invention. An evenly distributed magnetic field (static magnetic field) is generated by superconducting magnets 10-1 and 10-2, which are divided into two, along the center line indicated by a chain line. This is indicated by the arrow $B_0$. A sample tube 30, which contains a sample 31, is inserted from the direction vertical to the static magnetic field (x-axis direction in the figure). A probe 20, which contains a solenoidal radio frequency (RF) coil 25 for detecting signals from the sample 31, is inserted from the same direction as that of the static magnetic field. The probe 20 comprises the radio frequency (RF) coil 25 and a probe container 23 in which the radio frequency (RF) coil 25 is stored. Measuring equipment 35 sends a high frequency signal to the radio frequency (RF) coil 25 via the signal line 60, receives a high frequency signal from the sample 31, analyzes the result, and displays the measurement result on a display 36. Although not shown, a gradient magnetic field coil for generating a gradient magnetic field in the sample space is arranged outside the radio frequency (RF) coil 25.

Figure 6B:
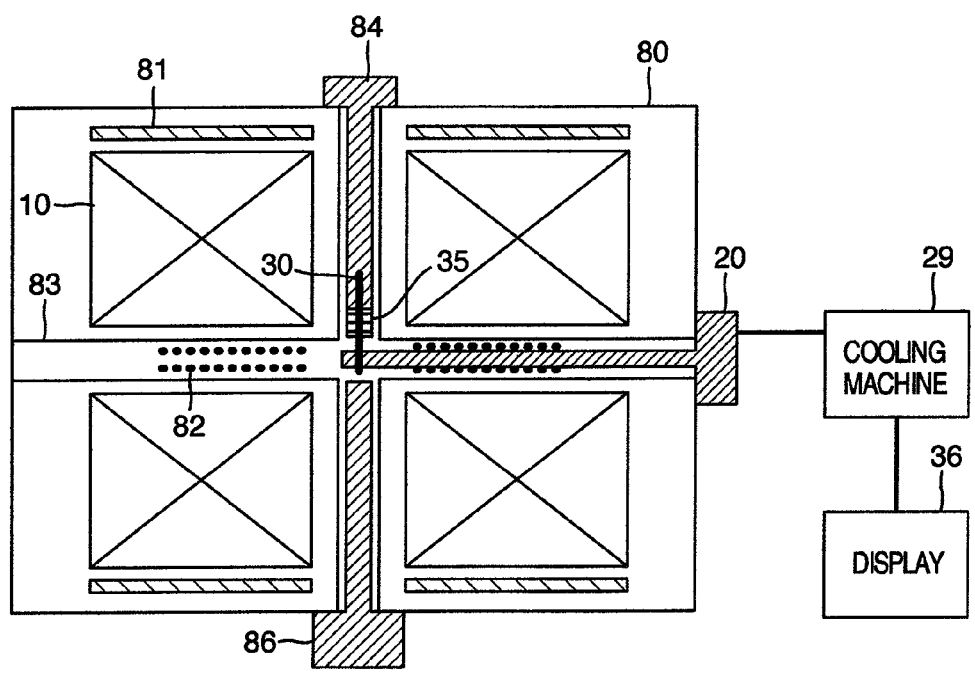
FIG. 6B is a diagram schematically showing more in detail the main components of the NMR apparatus shown in FIG. 6A.

FIG. 6B is a diagram showing in detail the frame format of the main components of the NMR apparatus of the present invention. The superconducting magnet 10 is provided in a cryostat 80 in which liquid helium is filled, and a superconducting shim coil 81 is provided outside the superconducting magnet to correct the static magnetic field. A crosswise bore 83 is provided in the cryostat of the magnet, and a room temperature shim coil 82 is provided in the bore. A sample tube rotating device 84 is provided from the vertical direction of the bore 83 and, within the sample tube rotating device 84, a spinner 85 that holds the sample tube 30 is inserted. The sample tube rotating device 84 sprays gas to the spinner 85 to rotate the sample tube 30. At the bottom of the bore, a sample temperature adjustment device 86 that flows temperature adjusting gas for adjusting the temperature of the sample is provided.

Figure 7:
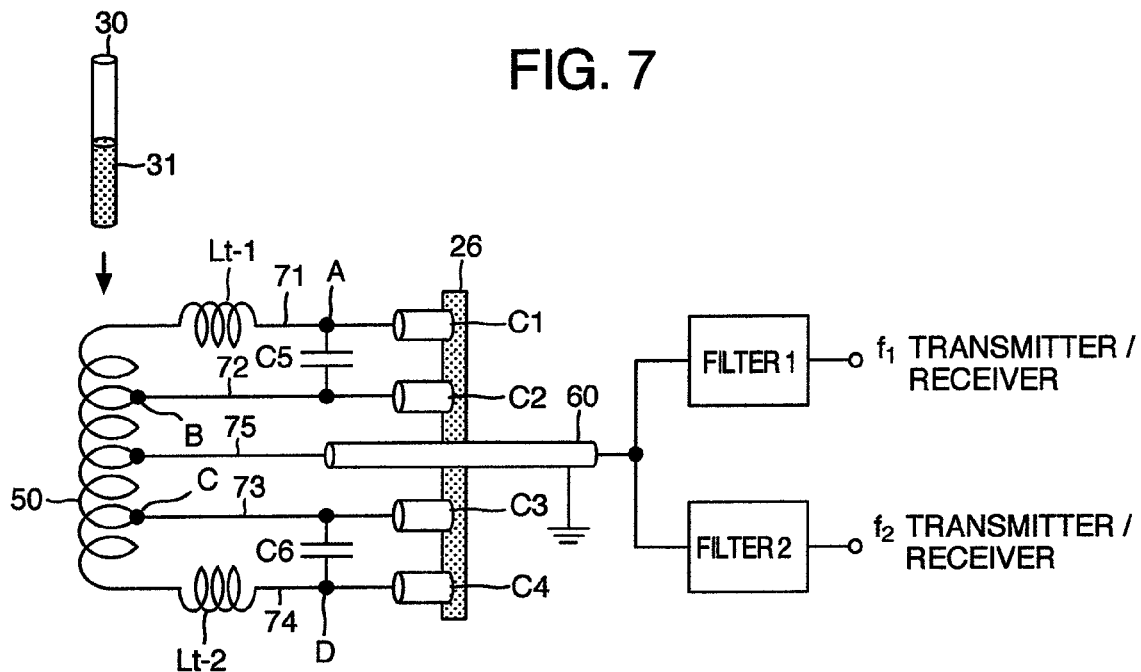
FIG. 7 is a diagram schematically showing the installation mode of a double resonance radio frequency (RF) coil circuit in a first embodiment.

FIG. 7 is a diagram schematically showing the configuration of the solenoidal type radio frequency (RF) coil in a first embodiment. In this embodiment, an 8-turn solenoidal radio frequency (RF) coil is used. The material of the RF coil is Cu wires. The signal line 60 is connected to a fifth lead line 75 extended from approximately the midpoint of an RF coil 50. Variable-capacitance trimmer capacitors C1 and C4 are connected to the ends of a first lead line 71 and a fourth lead line 74 that are extended from both ends of the turns of the RF coil 50. In addition, variable-capacitance trimmer capacitors C2 and C3 are connected to the ends of a second lead line 72 and a third lead line extended from point B and point C of the turns of the RF coil 50. The other electrodes of the trimmer capacitors (C1, C2, C3, C4) are grounded. The first lead line and the second lead line are connected via the capacitor C5, and the third lead line and the fourth lead line are connected via the capacitor C6.

A filter 1 and a filter 2 are provided beyond the branch after the signal line 60. The filter 1 is the band pass filter of the frequency $F_1$, and the filter 2 is the band pass filter of the frequency $F_2$. The high frequency signals at the frequencies $F_1$ and $F_2$, received by the radio frequency (RF) coil, are transmitted through the signal line 60 and are distributed at the branch point after the signal line 60, and those filters cause only the signals at the frequency $F_1$ to be transmitted to one of the branches and the signals at the frequency $F_2$ to be transmitted to the other of the branches. This configuration prevents leakage signals at different frequencies from entering the signal detector in a subsequent stage of the filters.

Figure 8:
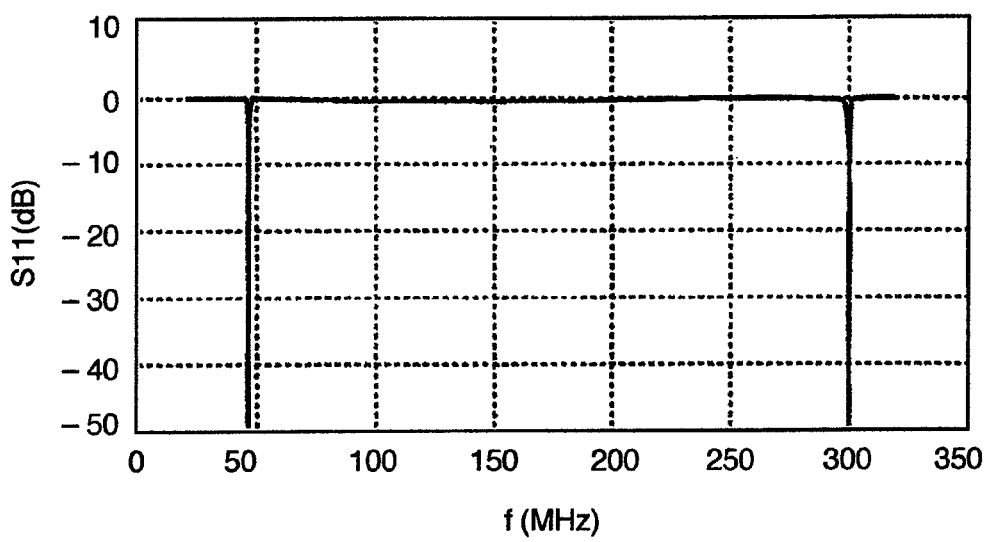
FIG. 8 is a diagram showing the $S_{11}$ reflection characteristics of the double resonance radio frequency (RF) coil circuit in the first embodiment.

FIG. 8 is a diagram showing the result of resonance characteristics evaluation obtained by using the circuit configuration described above as a radio frequency (RF) coil circuit for measuring the H nuclei and the D nuclei. FIG. 8 shows the reflection characteristics ($S_{11}$) of the input impedance viewed from the signal line 60 toward the radio frequency (RF) coil side. The figure indicates that the dips of the $S_{11}$ reflection are recognized at the resonant frequencies (H nuclei: $F_1$=300 MHz, D nuclei: $F_2$=46 MHz) and that the 50Ω matching is achieved at the two frequencies. This indicates that the double resonant circuit using one RF coil operates correctly.

In this embodiment, out of the area between the point A and the point B (RF coil element L1) of the RF coil 50, the area corresponding to about the half of the inductance is arranged around a sample, with the remaining area Lt-1 on the first lead line 71. Similarly, out of the area between the point C and the point D (RF coil element L3) of the RF coil 50, the area corresponding to about the half of the inductance is arranged around a sample, with the remaining area Lt-2 on the fourth lead line 74. The result of measuring the NMR signal in this configuration indicates that the signal detection sensitivity of the D nuclei is increased about 1.5 times.

Second Embodiment

Figure 9:
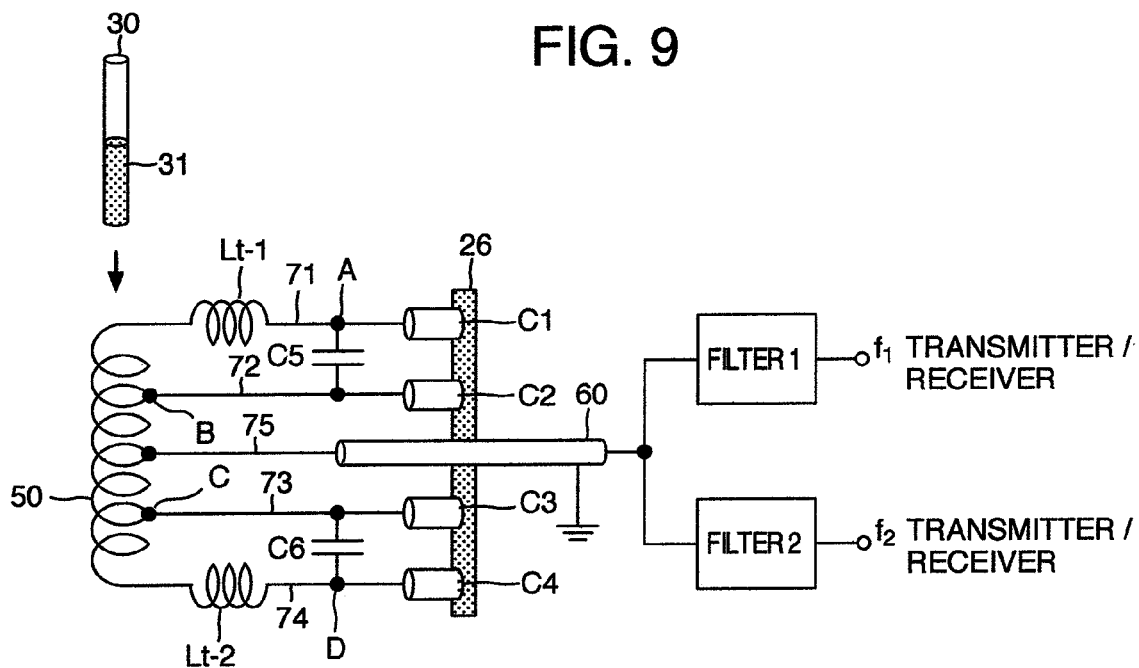
FIG. 9 is a diagram schematically showing the installation mode of a double resonance radio frequency (RF) coil circuit in a second embodiment.

In a second embodiment, a multiple nuclei measuring probe having a solenoidal radio frequency (RF) coil is proposed as in the first embodiment. FIG. 9 is a diagram showing the configuration of a radio frequency (RF) coil in the second embodiment. In this embodiment, a 9-turn solenoidal radio frequency (RF) coil is used. The material of the RF coil is Cu wires. A fifth lead line 75 is connected to the position at which the RF coil element L2 between the point B and the point C in an RF coil 50 is divided into two turns and three turns, and the end of the fifth lead line 75 is connected to the core line of a signal line 60. The other configuration, such as the configuration of lead lines and the arrangement of the trimmer capacitors, are the same as those in the first embodiment.

As a result of resonance characteristics evaluation made by using the circuit configuration described above as an radio frequency (RF) coil circuit for measuring the H nuclei and the D nuclei, it is recognized that the 50Ω impedance matching is achieved at the resonant frequencies (H nuclei: $F_1$=300 MHz, D nuclei: $F_2$=46 MHz) of the measured nuclides.

In this embodiment, out of the area between the point A and the point B (RF coil element L1) of the RF coil 50, the area corresponding to about the half of the inductance is arranged around a sample, with the remaining area Lt-1 on the first lead line 71. Similarly, out of the area between the point C and the point D (RF coil element L3) of the RF coil 50, the area corresponding to about the half of the inductance is arranged around a sample, with the remaining area Lt-2 on the fourth lead line 74. The result of measuring the NMR signal in this configuration indicates that the signal detection sensitivity of the D nuclei is increased about 1.5 times.

Third Embodiment

Figure 10A:
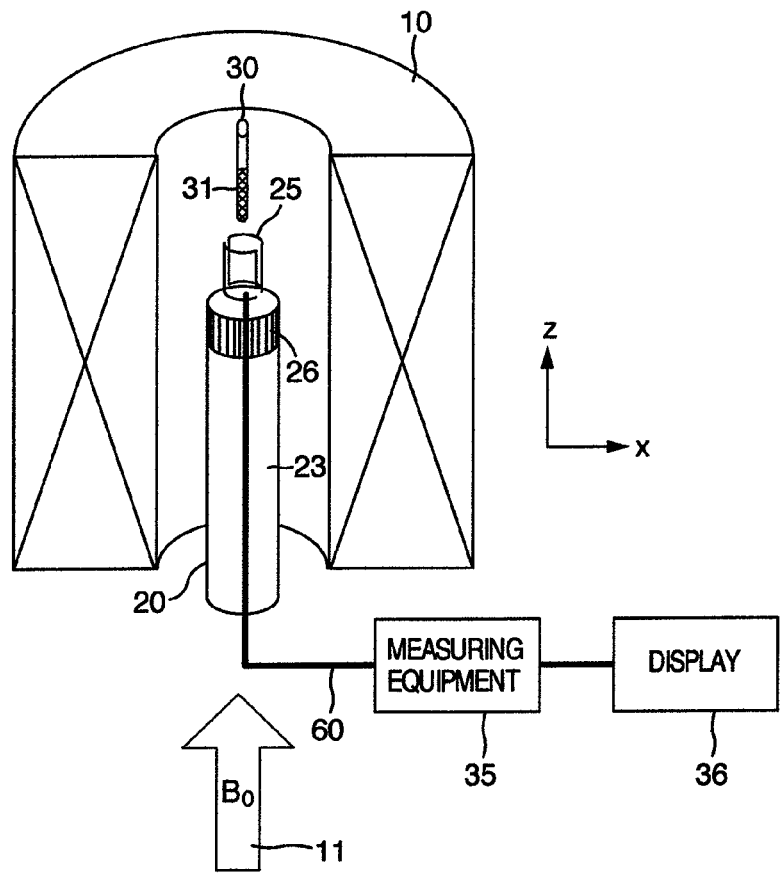
FIG. 10A is a perspective view showing the overview and the arrangement of the main components of an NMR apparatus that generates an evenly distributed magnetic field in the vertical direction.

In a third embodiment, the configuration, in which a saddle-type probe RF coil is used, is proposed. The saddle-type probe RF coil may be used for an NMR apparatus that generates a vertical direction static magnetic field ($B_0$) using a cylindrical magnet. FIG. 10A is a diagram showing the configuration of the NMR apparatus that generates a vertical direction static magnetic field. A cylindrical superconducting magnet 10 generates an evenly distributed magnetic field along the centerline indicated by a chain line. A probe 20 and a sample tube 30, which contains a sample 31, are inserted from the same direction as that of the static magnetic field (z-axis direction in the figure). The probe 20 comprises a radio frequency (RF) coil 25, a probe end stage 26, and a probe container 23 that contains them. Measuring equipment 35 sends a high frequency signal to the radio frequency (RF) coil 25 via a signal line 60, receives a high frequency signal from the sample 31, analyzes the result, and displays the measurement result on a display 36. Although not shown, a gradient magnetic field coil for generating a gradient magnetic field in the sample space is arranged outside the radio frequency (RF) coil 25.

Figure 10B:
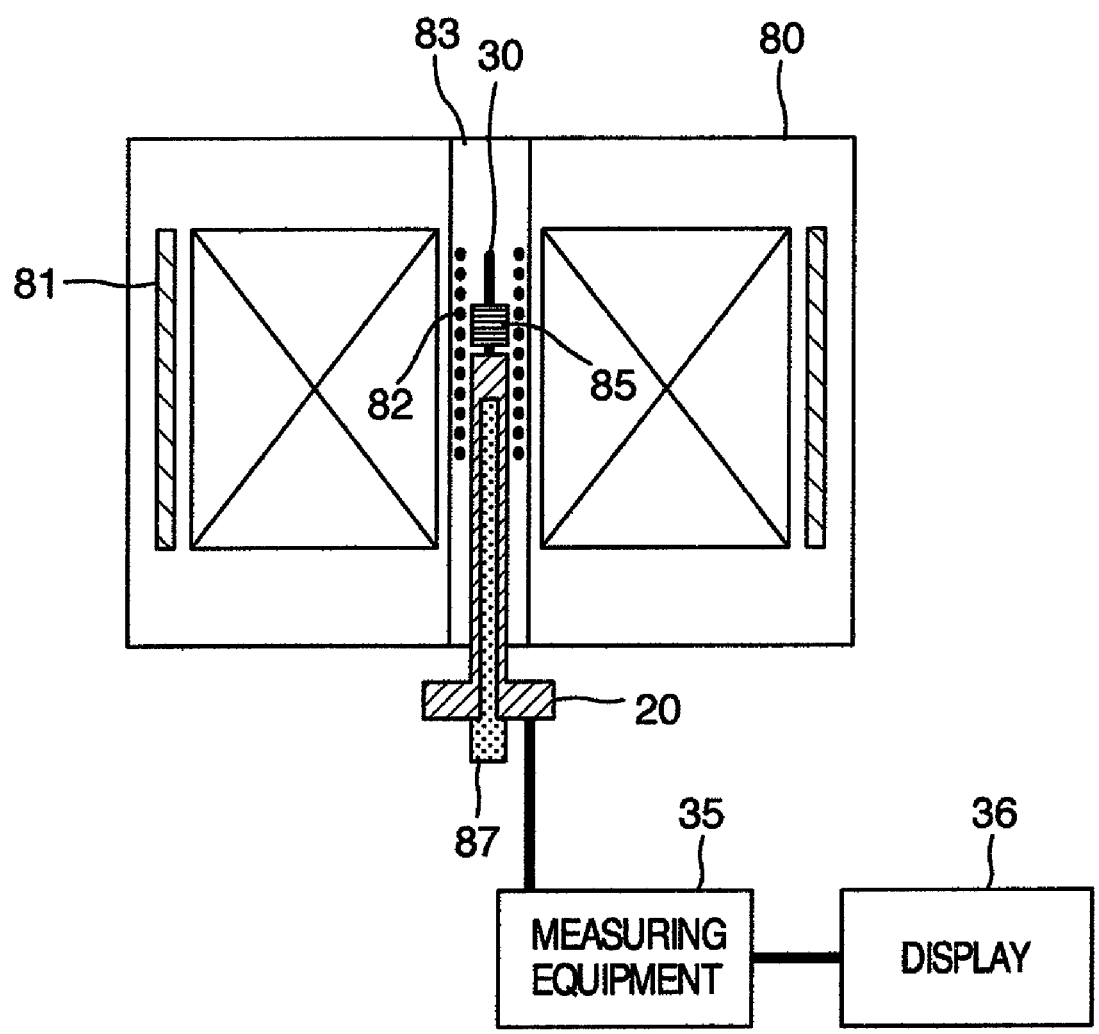
FIG. 10B is a diagram schematically showing in more detail the main components of the NMR apparatus shown in FIG. 10A.

FIG. 10B is a diagram schematically showing in more detail the main components of an NMR apparatus of the present invention. The superconducting magnet 10 is provided in a cryostat 80 in which liquid helium is filled, and a superconducting shim coil 81 is provided outside the superconducting magnet to correct the static magnetic field. A bore 83 is provided in the center of the cryostat of the magnet, and a room temperature shim coil 82 is provided in the bore. Also provided in the bore 83 is a sample tube rotation/sample temperature adjustment device 87 for rotating the sample tube with the gas and for controlling the sample temperature with the temperature adjusting gas. The sample tube 30, which is held by a spinner 85, is inserted in the sample tube rotation/sample temperature adjustment device 87.

Figure 11:
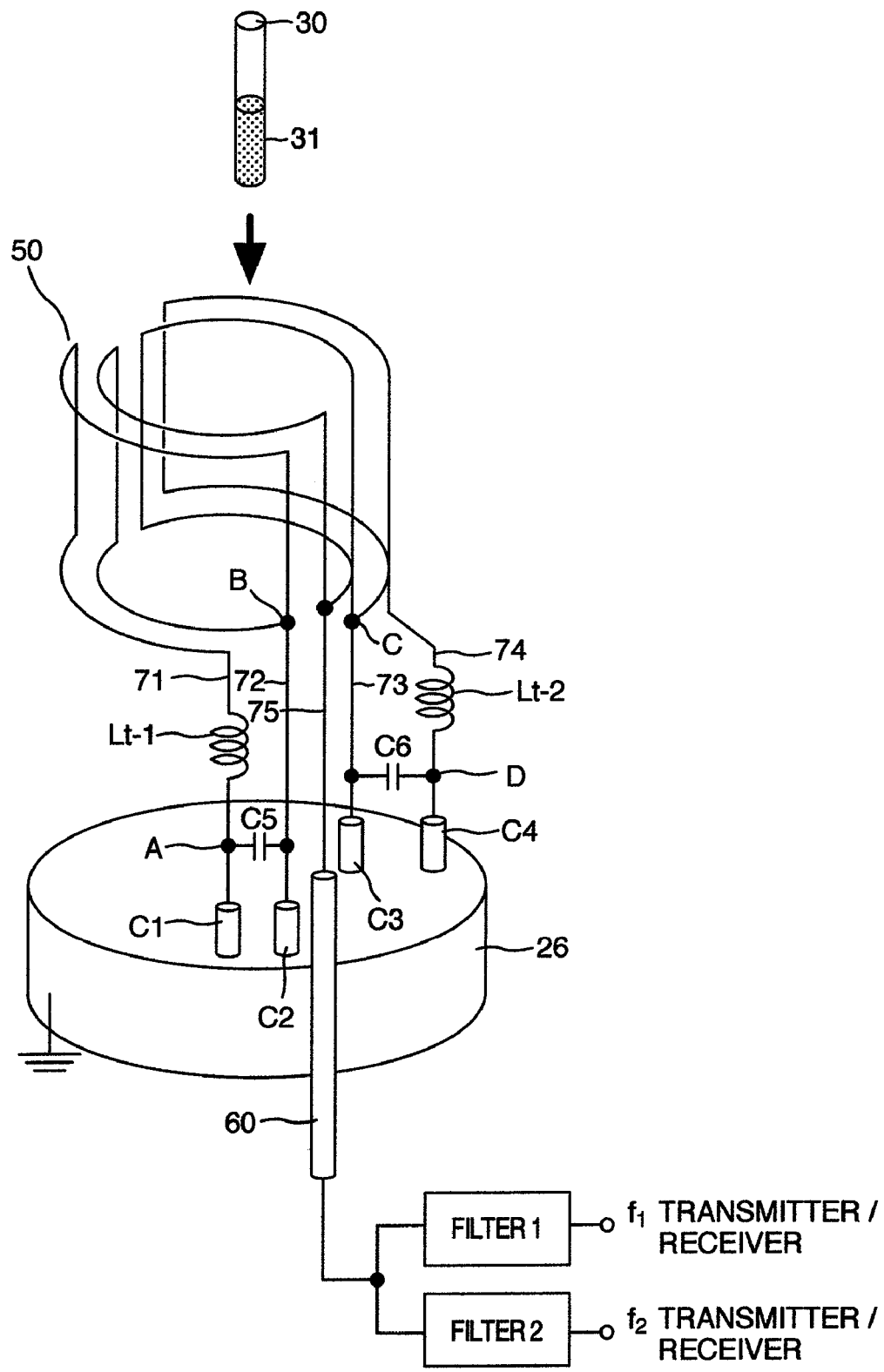
FIG. 11 is a diagram schematically showing the installation mode of a double resonance radio frequency (RF) coil circuit in a third embodiment.

FIG. 11 is a perspective view schematically showing the mode in which the saddle-type radio frequency (RF) coil in the third embodiment is installed. The RF coil is of the saddle coil shape composed of two turns×2. The material of the RF coil is Cu wires. As with the solenoidal RF coil shown in the first embodiment and the second embodiment, five lead lines are extended from the turns surrounding the sample tube 30, and their ends are connected to the trimmer capacitors C1, C2, C3, and C4 and to the core line of the signal line 60. Except for the shape of the radio frequency (RF) coil, this embodiment is similar in the equivalent circuit and its operation to the radio frequency (RF) coil circuit shown in the first embodiment and the second embodiment. At the frequency $F_1$ that is the higher of the two resonant frequencies, the circuit in this embodiment works as a circuit composed of the RF coil element L2 between the point B and the point C, C2, and C3. On the other hand, at the frequency $F_2$ that is the lower of the two resonant frequencies, both the RF coil element L1 between the point A and the point B and the RF coil element L3 between the point C and the point D also work as an RF coil that detects the signal from a sample.

As a result of resonance characteristics evaluation made by using the circuit configuration described above as an radio frequency (RF) coil circuit for measuring the H nuclei and the D nuclei, it is recognized that the 50Ω impedance matching is achieved at the resonant frequencies (H nuclei: $F_1$=300 MHz, D nuclei: $F_2$=46 MHz) of the measured nuclides.

In this embodiment, out of the area between the point A and the point B (RF coil element L1) of the RF coil 50, the area corresponding to about the half of the inductance is arranged around a sample, with the remaining area Lt-1 on the first lead line 71. Similarly, out of the area between the point C and the point D (RF coil element L3) of the RF coil 50, the area corresponding to about the half of the inductance is arranged around a sample, with the remaining area Lt-2 on the fourth lead line 74. The result of measuring the NMR signal in this configuration indicates that the signal detection sensitivity of the D nuclei is increased about 1.5 times.

Fourth Embodiment

Figure 12:
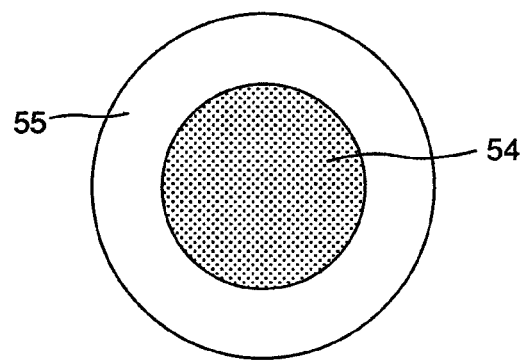
FIG. 12 is a diagram schematically showing the cross sectional structure of the wire of an RF coil used in a fourth embodiment.

In a fourth embodiment, a probe is proposed that controls the magnetization of the material used for an RF coil 50 to increase the evenness of the magnetic field near a sample for giving higher measurement sensitivity. FIG. 12 is a diagram schematically showing the cross sectional structure of the metal wire of an RF coil used in the fourth embodiment. This wire is a compound metal wire composed of two types of metal: paramagnetic metal 54 and diamagnetic metal 55. Compounding the paramagnetic metal 54 and diamagnetic metal 55 cancels the magnetization of both metals and decreases the magnetization of the whole wire. In this embodiment, Al is used as the paramagnetic metal 54, and the Cu is used as the diamagnetic metal 55. To cancel the magnetization of the paramagnetic metal (Al) 54 and the diamagnetic metal (Cu) 55, the diameter of the paramagnetic metal (Al) 54 is set to 0.38 mm and the diameter of the whole compound metal wire is set to 1 mm, considering the magnetic susceptibility of both metals at a low temperature.

The RF coil wire in this embodiment may be used for an NMR apparatus having the solenoidal radio frequency (RF) coil and for an NMR apparatus having the saddle-type radio frequency (RF) coil whose actual configurations are shown in the first, second, and third embodiments. Except for the wire structure of the RF coil 50, the configuration and the installation method of the radio frequency (RF) coil circuit are the same as those of the radio frequency (RF) coil circuits shown in the first, second, and third embodiments. Because the magnetization of the whole RF coil may be decreased in the probe in the fourth embodiment, the evenness of the magnetic field near a sample is increased. As a result, the measurement sensitivity of the probe in this embodiment is higher than that of the probe in the first, second, and third embodiments in which one type of metal (Cu) is used.

In the fourth embodiment, it is apparent that the same configuration may be used also when a metal other than Al (such as Ta, Pt, Ti, Nb, Rh) is used as the material of the paramagnetic metal 54 of the RF coil wire. In addition, it is apparent that the same configuration may be used also when a metal other than Cu (such as Ag, Au) is used as the material of the diamagnetic metal 55 of the RF coil wire. Although the wire of the two-layer structure, created by compounding a one-layer paramagnetic metal 54 and a one-layer diamagnetic metal 55, is shown in the fourth embodiment, it is of course possible to compound the paramagnetic metal 54 and the diamagnetic metal 55 in more layers (4-layer structure, 5-layer structure).

Fifth Embodiment

Figure 13:
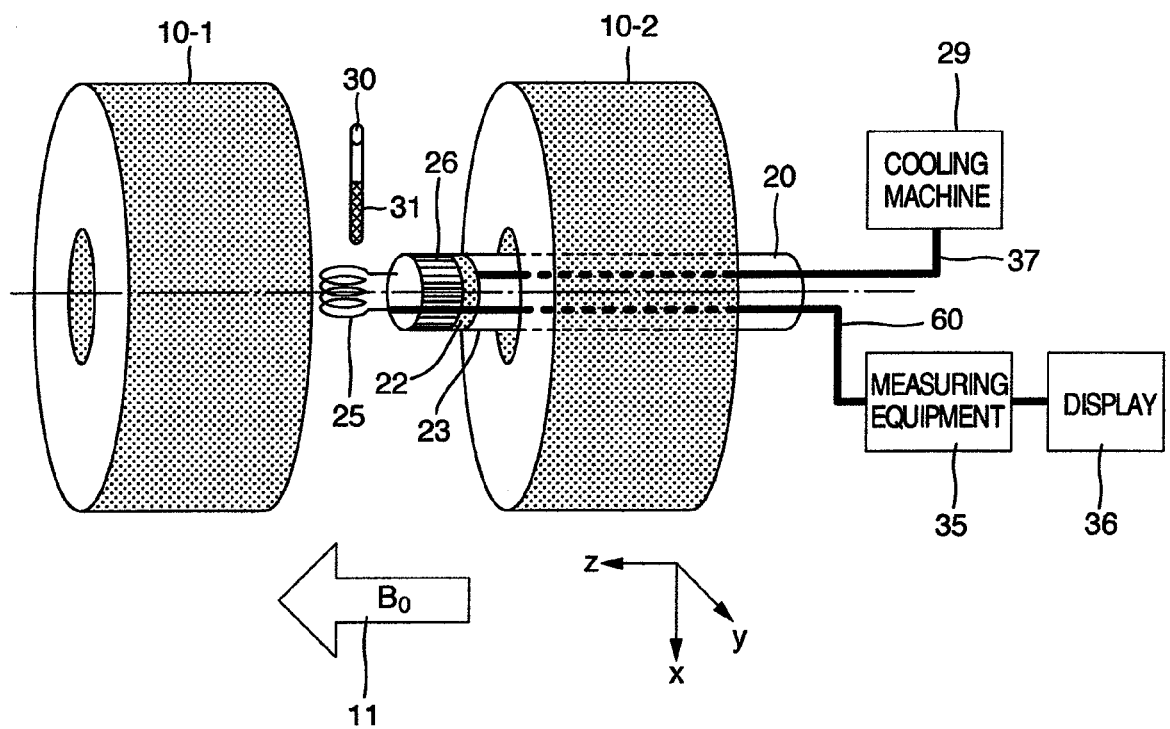
FIG. 13 is a perspective view showing the overview and the arrangement of the main components of an NMR apparatus in a fifth embodiment that has a probe that is cooled to a low temperature.

In a fifth embodiment, a probe is proposed whose RF coil 50 is cooled to a low temperature to increase the Q value of the radio frequency (RF) coil for giving high measurement sensitivity. FIG. 13 is a perspective view showing the overview and the arrangement of the main components of an NMR apparatus in the fifth embodiment. The configuration is basically the same as that of the NMR apparatus in the first and second embodiments shown in FIG. 6 except that there is provided a cooling machine 29 to cool the He gas for cooling a radio frequency (RF) coil 25 and that, within the probe 20, there are provided a heat exchanger 22 at the end of the cooling machine, which is the thermal source, and a cooling gas line 37 through which the He gas cooled by the cooling machine 29 is circulated for cooling the heat exchanger. A probe end stage 26 is cooled by the heat exchanger 22 and, through the heat transmission, the radio frequency (RF) coil 25 is cooled.

Figure 14:
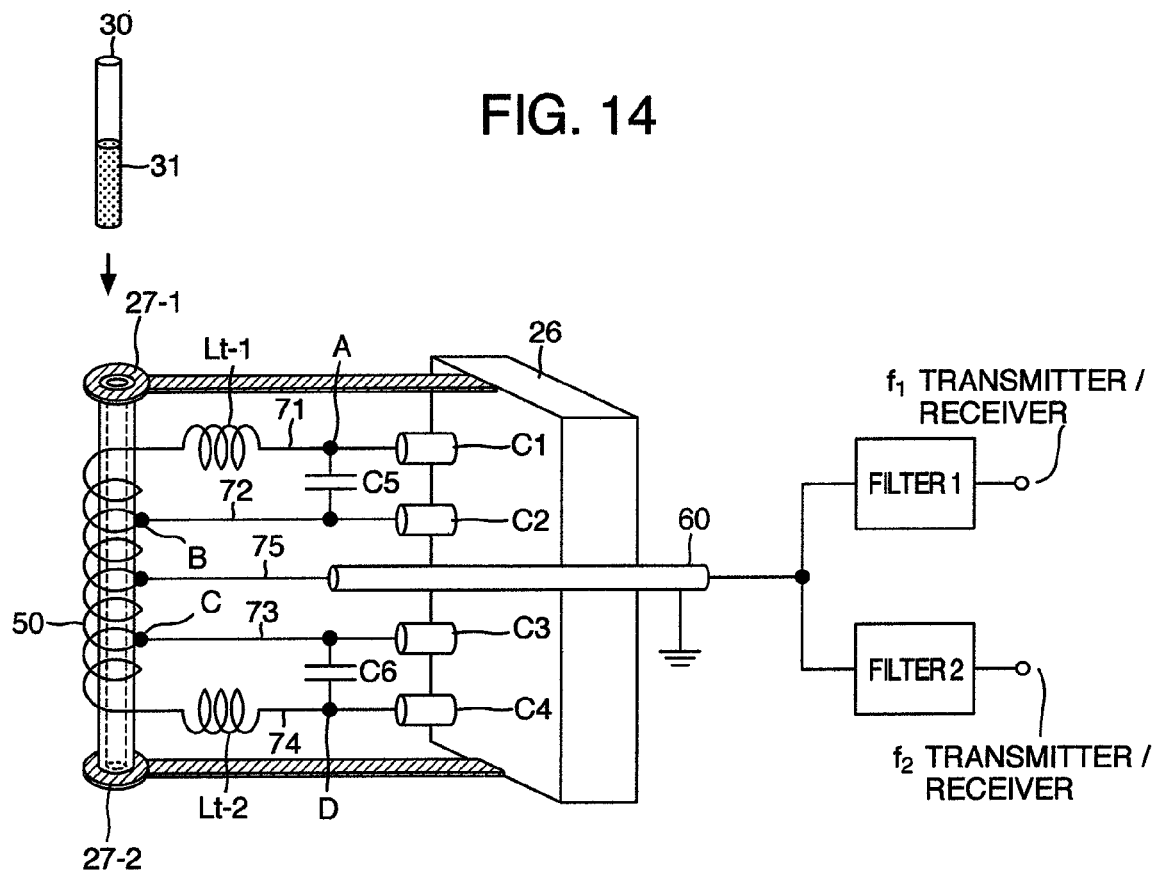
FIG. 14 is a diagram schematically showing the installation mode of a double resonance radio frequency (RF) coil circuit in the fifth embodiment.

FIG. 14 is a perspective view schematically showing the installation mode of the radio frequency (RF) coil 25 in this embodiment. A cylindrical bobbin 61 is fixed between two support plates 27-1 and 27-2 and the RF coil 50 is arranged around the cylindrical bobbin 61. The support plates 27-1 and 27-2 and the cylindrical bobbin 61 are made of sapphire ($Al_2O_3$). The material of the RF coil is Cu wires. Although not shown, the probe end stage 26 is thermally connected to the heat exchanger at the end of the cooling machine, which is the thermal source, and is cooled to a very low temperature. In addition, the probe end stage 26, support plates 27-1 and 27-2, and cylindrical bobbin 61 are thermally connected. Therefore, the RF coil 50 is cooled to a very low temperature through the heat transmission via the cylindrical bobbin 61 and the support plates 27-1 and 27-2. Basically, the configuration of this embodiment is the same as that of the first embodiment except the support plates 27-1 and 27-2 and the cylindrical bobbin 61.

As a result of resonance characteristics evaluation made by using the circuit configuration in FIG. 14 as radio frequency (RF) coil for measuring the H nuclei and the D nuclei in the same way as in the first embodiment, it is recognized that the 50Ω impedance matching is achieved at the resonant frequencies (H nuclei: $F_1$=300 MHz, D nuclei: $F_2$=46 MHz) of the measured nuclides. At the same time, cooling the RF coil 50 enables the Q value at the frequencies $F_1$ and $F_2$ to be increased about four times the Q value of a probe that operates at the room temperature.

In this embodiment, out of the area between the point A and the point B (RF coil element L1) of the RF coil 50, the area corresponding to about the half of the inductance is arranged around a sample, with the remaining area Lt-1 on the first lead line 71. Similarly, out of the area between the point C and the point D (RF coil element L3) of the RF coil 50, the area corresponding to about the half of the inductance is arranged around a sample, with the remaining area Lt-2 on the fourth lead line 74. The result of measuring the NMR signal in this configuration indicates that the signal detection sensitivity of the D nuclei is increased about three times the signal detection sensitivity of a probe that has a radio frequency (RF) coil circuit not having this configuration and that operates at the room temperature.

Although Cu is used as the material of the RF coil wire in the fifth embodiment, it is apparent that the same configuration may be used also when a diamagnetic metal other than Cu (such as Ag and Au) or a paramagnetic metal (such as Al, Ta, Pt, Ti, Nb, Rh) is used. In addition, though sapphire is used for the support plates 27-1 and 27-2 and the cylindrical bobbin 61, it is apparent that the same result may be obtained also when aluminum nitride (AlN) is used instead.

Sixth Embodiment

Figure 15:
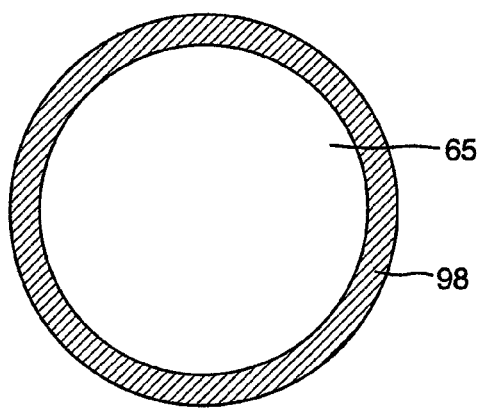
FIG. 15 is a diagram schematically showing the cross sectional structure of the wire of an RF coil used in a sixth embodiment.

In a sixth embodiment, a probe is proposed that uses a superconductor for the material of the RF coil to give still higher detection sensitivity. FIG. 15 is a diagram schematically showing the cross sectional structure of an RF coil wire used in the sixth embodiment. The wire has the two-layer structure composed of a metal wire 65 used as the base metal and a superconductive layer 98. The material of the metal wire 65 is Cu, which is formed into a solenoidal RF coil and the surface of which is coated by a superconductive magnesium diboride ($MgB_2$) thin film of 1 μm through the deposition method.

The installation mode and the circuit configuration of the radio frequency (RF) coil configured using the wire shown in FIG. 15 are the same as those in the fifth embodiment. An RF coil 50 configured by a superconductor-coated wire is cooled to a low temperature through heat transmission. In the radio frequency (RF) coil in this embodiment, because the low-resistance superconductive thin film is coated on the surface of the RF coil wire through which a large amount of high frequency current flows when a signal is detected, the resistive loss can be reduced more efficiently than when a normal conductor RF coil is cooled to a low temperature. As a result, the Q value is increased two to four times that of a radio frequency (RF) coil of normal conduction metal that has not this configuration. The use of this radio frequency (RF) coil as the NMR apparatus significantly increases the measurement sensitivity.

In the sixth embodiment, the $MgB_2$ thin film is used for the superconductive layer 98 of the RF coil wire. It is apparent that the same result may be obtained also when an Nb alloy (such as $Nb_3Sn$) or an oxide high-temperature superconductor such as YBCO is used for the superconductive material in the same configuration. It is apparent that the same configuration may be used also when a diamagnetic metal other than Cu (such as Ag and Au) or a paramagnetic metal (such as Al, Ta, Pt, Ti, Nb, Rh) is used for the material of the metal wire 65 of the RF coil wire. In addition, though sapphire is used for the support plates 27-1 and 27-2 and the cylindrical bobbin 61, it is apparent that the same result may be obtained also when aluminum nitride (AlN) is used instead.

Seventh Embodiment

Figure 16:
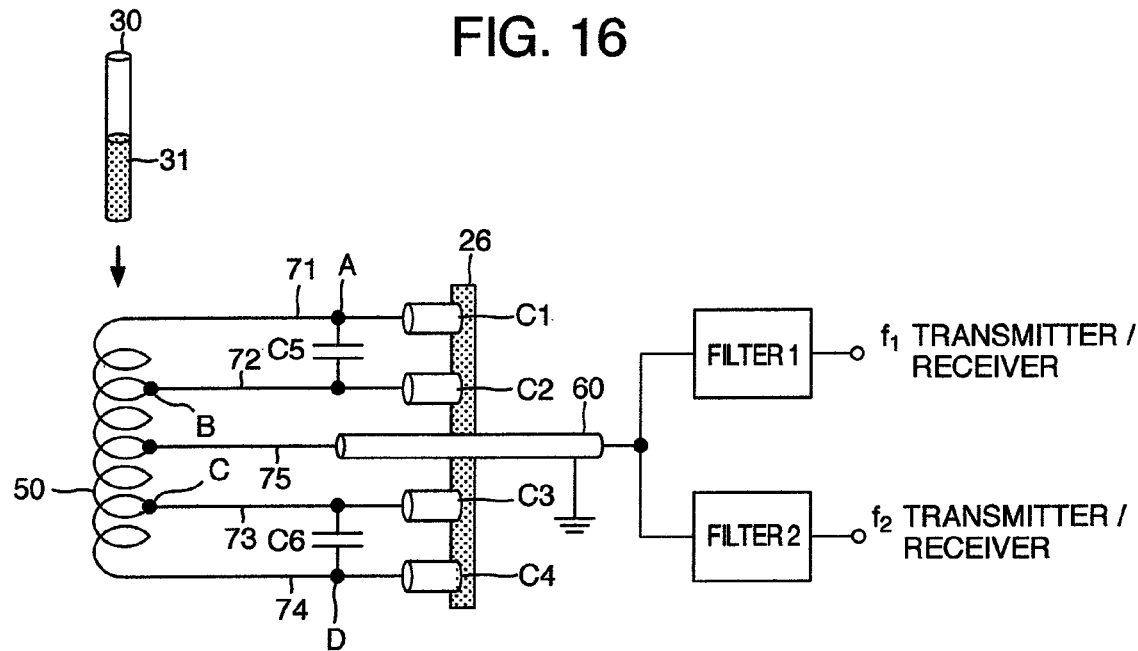
FIG. 16 is a diagram schematically showing the installation mode of a double resonance radio frequency (RF) coil circuit in a seventh embodiment.

In a seventh embodiment, a multiple nuclei measuring probe having a solenoidal radio frequency (RF) coil, similar to that in the first embodiment, is proposed. FIG. 16 is a diagram schematically showing the mode in which the radio frequency (RF) coil in the seventh embodiment is installed. The basic configuration is the same as that of the first embodiment except for the arrangement of the inductors related to the detection of signals at the frequency $F_2$. This embodiment is different from the first embodiment in that, out of the area between the point A and the point B (RF coil element L1) of a RF coil 50, the area corresponding to about all of the inductance is arranged around the sample. Similarly, out of the area between the point C and the point D (RF coil element L3) of the RF coil 50, the area corresponding to about all of the inductance is arranged around the sample. The result of measuring the NMR signal in this configuration indicates that the signal detection sensitivity of the D nuclei is increased about 1.8 times.

Eighth Embodiment

Figure 17:
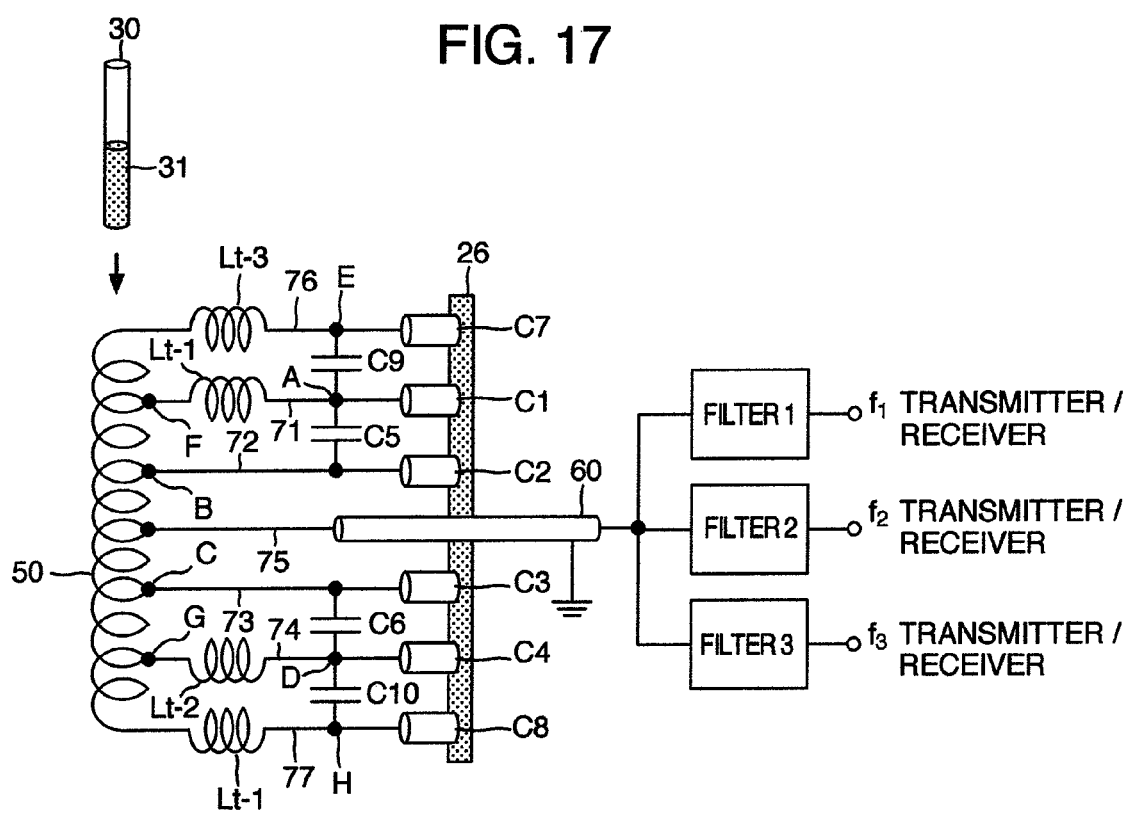
FIG. 17 is a diagram schematically showing the installation mode of a triple resonance radio frequency (RF) coil circuit in an eighth embodiment.

In an eighth embodiment, a multiple resonance radio frequency (RF) coil is proposed that uses one RF coil to send and receive high frequency signals at three different resonant frequencies. The circuit configuration of the eighth embodiment can be used as a multiple resonance radio frequency (RF) coil that can process the H, D, and C nucleus. FIG. 17 is a diagram schematically showing the installation mode of the radio frequency (RF) coil. The basic configuration is the same as that of the first embodiment except that the radio frequency (RF) coil circuit in the eighth embodiment has more turns on an RF coil 50 and has more lead lines and trimmer capacitors to give a resonance peak where the impedances are matched to 50Ω at the three resonant frequencies.

As in the first embodiment, a filter 1, a filter 2, and a filter 3, which work as the band pass filters of signals at 300 MHz, 46 MHz, and 75 MHz respectively, prevent leakage signals at different frequencies from entering the signal detector in a subsequent stage of the filters. As a result of evaluating the frequency dependency of the input impedances viewed from a signal line 60 toward the radio frequency (RF) coil side, the resonance peak is obtained where the impedances are matched to 50Ω at the 300 MHz, 46 MHz, and 75 MHz.

In this embodiment, out of the area between the point A and the point B (RF coil element L1) of the RF coil 50, the area corresponding to about the half of the inductance is arranged around a sample, with the remaining area Lt-1 on the first lead line 71. Similarly, out of the area between the point C and the point D (RF coil element L3) of the RF coil 50, the area corresponding to about the half of the inductance is arranged around a sample, with the remaining area Lt-2 on the fourth lead line 74. Similarly, out of the area between the point E and the point F (RF coil element L4) of the RF coil 50, the area corresponding to about the half of the inductance is arranged around a sample, with the remaining area Lt-3 on the sixth lead line 76. Similarly, out of the area between the point G and the point H (RF coil element L5) of the RF coil 50, the area corresponding to about the half of the inductance is arranged around a sample, with the remaining area Lt-4 on the seventh lead line 77. The result of measuring the NMR signal using the probe having the configuration of this embodiment indicates that the signal detection sensitivity of the D nuclei and the C nuclei is increased about 1.5 times.

Ninth Embodiment

In a ninth embodiment, a double resonance radio frequency (RF) coil circuit suitable for measuring a sample with a high specific inductive capacity is proposed. As shown in the first embodiment (FIG. 7), the parameters are set in this present invention so that the RF coil element L1 and C5 in the area between the point A and the point B resonate in parallel at the resonant frequency $F_1$ of the first nuclide. This parameter setting is applied also to the RF coil element L3 and C6 in the area from the point C and point D. However, when a sample 31 with a high specific inductive capacity is inserted in a RF coil 50, a parasitic capacitance is added to the RF coil 50. This added parasitic capacitance changes the effective inductances of L1 and L3 which, in turn, cause the parallel resonance frequency of a trap circuit 56-1, composed of L1 and C5, and the parallel resonance frequency of a trap circuit 56-2, composed of L3 and C6, to be shifted from $F_1$. The circuit in the ninth embodiment has the configuration for readjusting the parallel resonance frequency, which is shifted from $F_1$ when the sample is inserted, to $F_1$.

Figure 18:
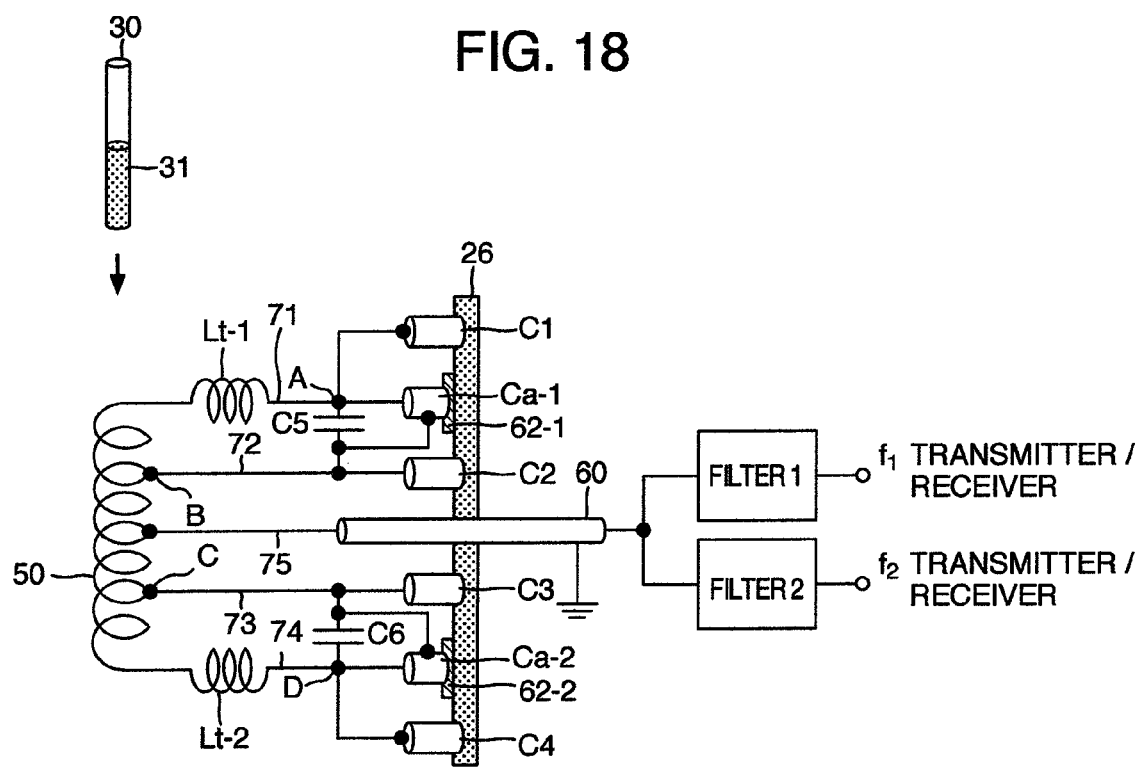
FIG. 18 is a diagram schematically showing the installation mode of a double resonance radio frequency (RF) coil circuit in a ninth embodiment.

FIG. 18 is a diagram schematically showing the installation mode of the radio frequency (RF) coil circuit in the ninth embodiment. The basic circuit configuration is the same as that of the first embodiment except that, in the ninth embodiment, an adjustment trimmer capacitor Ca-1 is connected to the fifth capacitor C5 in parallel. Similarly, an adjustment trimmer capacitor Ca-2 is connected to the sixth capacitor C6 in parallel. Ca-1 and Ca-2 are installed on insulating pedestals 62-1 and 62-2 provided on a probe end stage 26. This structure makes the Ca-1 and Ca-2 electrically disconnected from the probe end stage 26 that works as the ground. In this state, the electrodes at the both ends of Ca-1 are connected to the electrodes at the both ends of C5. Similarly, the electrodes at the both ends of Ca-2 are connected to the electrodes at the both ends of C6. Although not shown, a shaft for adjusting the trimmer capacitors, extended from the rear of the probe to the probe end stage 26, changes the capacitances of Ca-1 and Ca-2.

By observing the resonance peak near the frequency $F_1$ while changing the values of C1 and Ca-1 after the sample 31 is inserted into the RF coil 50, the value of Ca-1 may be used to check whether or not the resonance peak is changed depending on the value of C1. Because the resonance peak near the frequency $F_1$ is not affected by the value of C1 when the parallel resonant frequency of L1 and C5 is just $F_1$, the capacitance value of Ca-1 is adjusted and fixed in that state. After that, by observing the resonance peak near $F_1$ while changing the values of C4 and Ca-2 also for Ca-2, Ca-2 is adjusted so that the resonance peak is not affected by C4. By making the pre-adjustment described above, it is possible to create the state in which the resonance peak at the frequency $F_1$ is not affected by C1 and C4 and to implement 50Ω matching for the resonance peak at $F_1$ through the adjustment of C2 and C3 and 50Ω matching for the resonance peak at $F_2$ through the adjustment of C1 and C4.

As a result of resonance characteristics evaluation made by using the circuit configuration described above as an radio frequency (RF) coil circuit for measuring the H nuclei and the D nuclei, it is recognized that the 50Ω impedance matching is achieved at the resonant frequencies (H nuclei: $F_1$=300 MHz, D nuclei: $F_2$=46 MHz) of the measured nuclides.

In this embodiment, out of the area between the point A and the point B (RF coil element L1) of the RF coil 50, the area corresponding to about the half of the inductance is arranged around a sample, with the remaining area Lt-1 on the first lead line 71. Similarly, out of the area between the point C and the point D (RF coil element L3) of the RF coil 50, the area corresponding to about the half of the inductance is arranged around a sample, with the remaining area Lt-2 on the fourth lead line 74. The result of measuring the NMR signal in this configuration indicates that the signal detection sensitivity of the D nuclei is increased about 1.5 times.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A probe for NMR measurement comprising:
a measuring Radio Frequency (RF) coil for measuring a nuclear magnetic resonance (NMR) that sends a high frequency signal at a predetermined resonant frequency to a sample placed in an evenly distributed magnetic field and, at the same time, receives a free induction decay (FID) signal emitted from the sample in response to the high frequency signal that has been sent;
a signal line through which the high frequency signal and the FID signal are sent to said measuring RF coil;
a stage that holds said measuring RF coil; and
a probe container that holds said stage, wherein
said measuring RF coil comprises turns and lead lines, said turns comprising a conductive line provided from one end to another end in such a way that the line surrounds a sample tube in which the sample is stored, said lead lines being extended from both ends of said turns,
a first capacitor (C1) is connected to an end of a first lead line extended from one end of said turns,
a second capacitor (C2) is connected to an end of a second lead line extended from a turn provided between the both ends of said turns,
a third capacitor (C3) is connected to an end of a third lead line extended from a turn provided between the both ends of said turns, a position of said turn being different from a position of the turn of said second lead line,
a fourth capacitor (C4) is connected to an end of a fourth lead line extended from another end of said turns,
another end of each of said first, second, third, and fourth capacitors is grounded,
said first lead line and said second line are connected via a fifth capacitor (C5),
said third lead line and said fourth line are connected via a sixth capacitor (C6), and
a fifth lead line, which is connected between a lead-out point on said turn of said second lead line and a lead-out point on said turn of said third lead line, is connected to said signal line.

2. The probe for NMR measurement according to claim 1, wherein
a connection point on said turns from which said fifth lead line is extended is provided in a range of 30% to 70% of a length on said turns from a connection point on the turn from which said second lead line is extended and a connection point on the turn from which said third lead line is extended.

3. The probe for NMR measurement according to claim 1, wherein
a shape of said turns is a solenoid type or a saddle type.

4. The probe for NMR measurement according to claim 1, wherein
an inductor is inserted between one end of said turns and said fifth capacitor and/or between another end of said turns and said sixth capacitor.

5. The probe for NMR measurement according to claim 1 further comprising a variable capacitor in parallel to said fifth capacitor (C5) and in parallel to said sixth capacitor (C6).

6. The probe for NMR measurement according to claim 1, wherein
a material of said RF coil is a compound of a paramagnetic metal material and a diamagnetic metal material.

7. The probe for NMR measurement according to claim 1, wherein
a material of said RF coil is a conductive material created by coating an Nb superconductive material, a cupper oxide superconductive material, or a magnesium diboride ($MgB_2$) on a surface of a metal material of said RF coil.

* * * * *